(12) United States Patent
Jiang et al.

(10) Patent No.: US 11,005,595 B2
(45) Date of Patent: May 11, 2021

(54) SELF-DECODABILITY FOR LOW-DENSITY PARITY-CHECK CODES

(71) Applicant: QUALCOMM Incorporated, San Diego, CA (US)

(72) Inventors: Jing Jiang, San Diego, CA (US); Gabi Sarkis, San Diego, CA (US); Yang Yang, San Diego, CA (US); Ying Wang, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 30 days.

(21) Appl. No.: 16/412,237

(22) Filed: May 14, 2019

(65) Prior Publication Data

US 2019/0379485 A1 Dec. 12, 2019

Related U.S. Application Data

(60) Provisional application No. 62/681,975, filed on Jun. 7, 2018.

(51) Int. Cl.
*H04L 1/00* (2006.01)
*H03M 13/11* (2006.01)

(52) U.S. Cl.
CPC ....... *H04L 1/0041* (2013.01); *H03M 13/1105* (2013.01); *H04L 1/0045* (2013.01); *H04L 1/0057* (2013.01)

(58) Field of Classification Search
None
See application file for complete search history.

(56) References Cited

U.S. PATENT DOCUMENTS 8,527,831 B2 * 9/2013 Li ............... H03M 13/1122
714/755
10,291,359 B2 * 5/2019 Xu ................ H04L 1/1671
(Continued)

FOREIGN PATENT DOCUMENTS

WO WO-2017123273 A1 7/2017

OTHER PUBLICATIONS

Fatemeh H-S., et al., "Analysis of 5G LDPC Codes Rate-Matching Design", 2018 IEEE 87th Vehicular Technology Conference (VTC Spring), IEEE, Jun. 3, 2018 (Jun. 3, 2018), pp. 1-5, XP033377323, DOI: 10.1109/VTCSPRING.2018.8417496, [retrieved on Jul. 20, 2018].

(Continued)

*Primary Examiner* — Phung M Chung

(57) ABSTRACT

A technique for hybrid automatic repeat request (HARD) transmissions using low-density parity-check (LDPC) coding with self-decodable retransmissions is disclosed. Data is encoded using a low-density parity check code to obtain encoded data, where the encoded data includes core data and non-core data. The encoded data is then stored in a buffer for transmission. A plurality of redundancy versions of the encoded data is then transmitted, wherein all redundancy versions of encoded data include core data, and each of the transmitted redundancy versions of the encoded data includes at least a different subset of the core data. The core data may be reordered prior to obtaining at least one of the different subsets of core data. Each of the transmitted redundancy versions of the encoded data includes sufficient core data to permit self-decodability of the transmission at a receiver.

30 Claims, 16 Drawing Sheets

(56) References Cited

U.S. PATENT DOCUMENTS 10,454,499 B2 * 10/2019 Richardson ........ H03M 13/1168
2018/0367245 A1 * 12/2018 Soriaga ............... H03M 13/616

OTHER PUBLICATIONS

International Search Report and Written Opinion—PCT/US2019/032386—ISA/EPO—dated Sep. 2, 2019.
Qualcomm Incorporated: "LDPC Rate Matching", 3GPP Draft, R1-1713462_LDPC Rate_Matching, 3rd Generation Partnership Project (3GPP), Mobile Competence Centre, 650, Route Des Lucioles, F-06921 Sophia-Antipolis Cedex, France, vol. RAN WG1, No. Prague, Czech Republic, Aug. 21, 2017-Aug. 25, 2017, Aug. 20, 2017 (Aug. 20, 2017), XP051316263, 7 pages, Retrieved from the Internet :URL: http://www.3gpp.org/ftp/Meetings_3GPP_SYNC/RAN1/Docs/ [retrieved on Aug. 20, 2017], p. 2-p. 3.

* cited by examiner

SELF-DECODABILITY FOR LOW-DENSITY PARITY-CHECK CODES

CROSS REFERENCE TO RELATED APPLICATIONS

The present Application for Patent claims priority to U.S. Provisional Application No. 62/681,975 filed Jun. 7, 2018, which is hereby expressly incorporated by reference.

FIELD OF THE INVENTION

The present disclosure relates to error correcting codes for communications, and more particularly, to methods and apparatus, for using low-density parity-check codes with self-decodability.

BACKGROUND

Wireless communication networks are widely deployed to provide various communication services such as voice, video, packet data, messaging, broadcast, etc. These wireless networks may be multiple-access networks capable of supporting multiple users by sharing the available network resources. Examples of such multiple-access networks include Code Division Multiple Access (CDMA) networks, Time Division Multiple Access (TDMA) networks, Frequency Division Multiple Access (FDMA) networks, Orthogonal FDMA (OFDMA) networks, and Single-Carrier FDMA (SC-FDMA) networks.

As the use of mobile wireless devices, such as smart phones and tablet devices, becomes more ubiquitous, the demands on the limited amount of radio frequency spectrum used by those devices has increased, resulting in wireless network congestion and reduced bandwidth for devices operating in the licensed spectrum. A variety of techniques have been introduced to provide improve the effective data throughput, including coding and error correction. Furthermore, techniques for encoding and modulating data can improve efficient usage of bandwidth as well as enable reliable decoding or error detection at a receiver.

SUMMARY

A method and apparatus are provided for wireless communication at a transmitter. Data may be encoded using a low-density parity check code to obtain encoded data, where the encoded data includes core data and non-core data. The encoded data may then be stored in a buffer (e.g., a circular buffer) for transmission. The non-core data may include parity data for forward error correction. The low-density parity check code may use a quasi-cyclic lifting structure. The quasi-cyclic lifting structure may be a sparse bipartite graph having a core part that is more densely populated than a non-core part.

A plurality of redundancy versions of the encoded data may then be transmitted, wherein all redundancy versions of encoded data include core data, and each of the transmitted redundancy versions of the encoded data includes at least a different subset of the core data. Each of the transmitted redundancy versions of the encoded data may include sufficient core data to permit self-decodability of the transmission at a receiver. The core data may be reordered prior to obtaining at least one of the different subsets of core data.

In one example, a transmission of a first redundancy version of the encoded data includes all of the core data, while a transmission of a second redundancy version of the encoded data includes fewer than all of the core data.

According to one aspect, the plurality of redundancy versions may be selected from a set of redundancy versions, where the set of redundancy versions and their transmission order is preconfigured, and wherein each of the set of redundancy versions includes sufficient core data to permit self-decodability. In some instances, each of the set of redundancy versions may have a first starting point for the core data and a second starting point for the non-core data, which are known to the intended receiver.

In some examples, transmitting a plurality of redundancy versions of the encoded data may include: (a) transmitting a first redundancy version of the encoded data, wherein the first redundancy version of the encoded data includes at least a first subset of the core data; (b) transmitting a second redundancy version of the encoded data, wherein the second redundancy version of the encoded data includes at least a second subset of the core data different from the first subset of core data, and where the core data is reordered prior to obtaining the second subset of core data; and/or (c) transmitting a third redundancy version of the encoded data, wherein the third redundancy version of the encoded data includes at least a third subset of the core data different from the first and second subsets of core data, and the same reordered core data is used to obtain the second and third subsets of core data. In some implementations, the first subset of the core data may include all the core data. The second subset of the core data may include fewer than all the core data. The second redundancy version of the encoded data may include more non-core data than the first redundancy version of the encoded data. The second redundancy version of the encoded data may be transmitted upon receipt of an indicator to retransmit the encoded data. In another example, the first redundancy version of the encoded data has a higher transmission rate for the data than the second redundancy version of the encoded data.

A method operational and apparatus are provided for wireless communication at a receiver. A plurality of redundancy versions of encoded data may be received, where the encoded data includes core data and non-core data, wherein each of the received redundancy versions of the encoded data includes at least a different subset of the core data. The non-core data may include parity data for forward error correction. The encoded data may be obtained from one or more of the plurality of redundancy versions of encoded data. For instance, the encoded data may be obtained by combining likelihood ratios for the received plurality of redundancy versions of the encoded data. The plurality of redundancy versions may be selected from a set of redundancy versions, where the set of redundancy versions and their transmission order is pre-arranged with a transmitter.

In one example, each of the received redundancy versions of the encoded data includes sufficient core data to permit self-decodability of the encoded data.

The encoded data may then be decoded using a low-density parity check code to obtain decoded data. The low-density parity check code may use a quasi-cyclic lifting structure. The quasi-cyclic lifting structure may be a sparse bipartite graph having a core part that is more densely populated than a non-core part.

In one example, each of the set of redundancy versions may have a first starting point for the core data and a second starting point for the non-core data, which are provided to the receiver.

In some implementations, a first redundancy version of the encoded data may include all of the core data, while a second redundancy version of the encoded data may include less than all the core data.

In another example, receiving a plurality of redundancy versions of the encoded data may include: (a) receiving a first redundancy version of the encoded data, wherein the first redundancy version of the encoded data includes at least a first subset of the core data; (b) receiving a second redundancy version of the encoded data, wherein the second redundancy version of the encoded data includes at least a second subset of the core data different from the first subset of core data, and where the second subset of core data is based on a reordered version of the core data relative to the first subset of core data; and/or (c) receiving a third redundancy version of the encoded data, wherein the third redundancy version of the encoded data includes at least a third subset of the core data different from the first and second subsets of core data, and the second subset and third subset of core data is based on the same reordered core data. In various examples, the first subset of the core data may include all the core data, and the second subset of the core data may include fewer than all the core data. The second redundancy version of the encoded data may include more non-core data than the first redundancy version of the encoded data. The receiver may send an indicator to retransmit the encoded data prior to receiving the second redundancy version of the encoded data. In some instances, a block length of the second redundancy version of the encoded data is different than first redundancy version of the encoded data. In other instances, a block length of the second redundancy version of the encoded data is the same as first redundancy version of the encoded data.

DETAILED DESCRIPTION OF THE INVENTION

Figure 1:
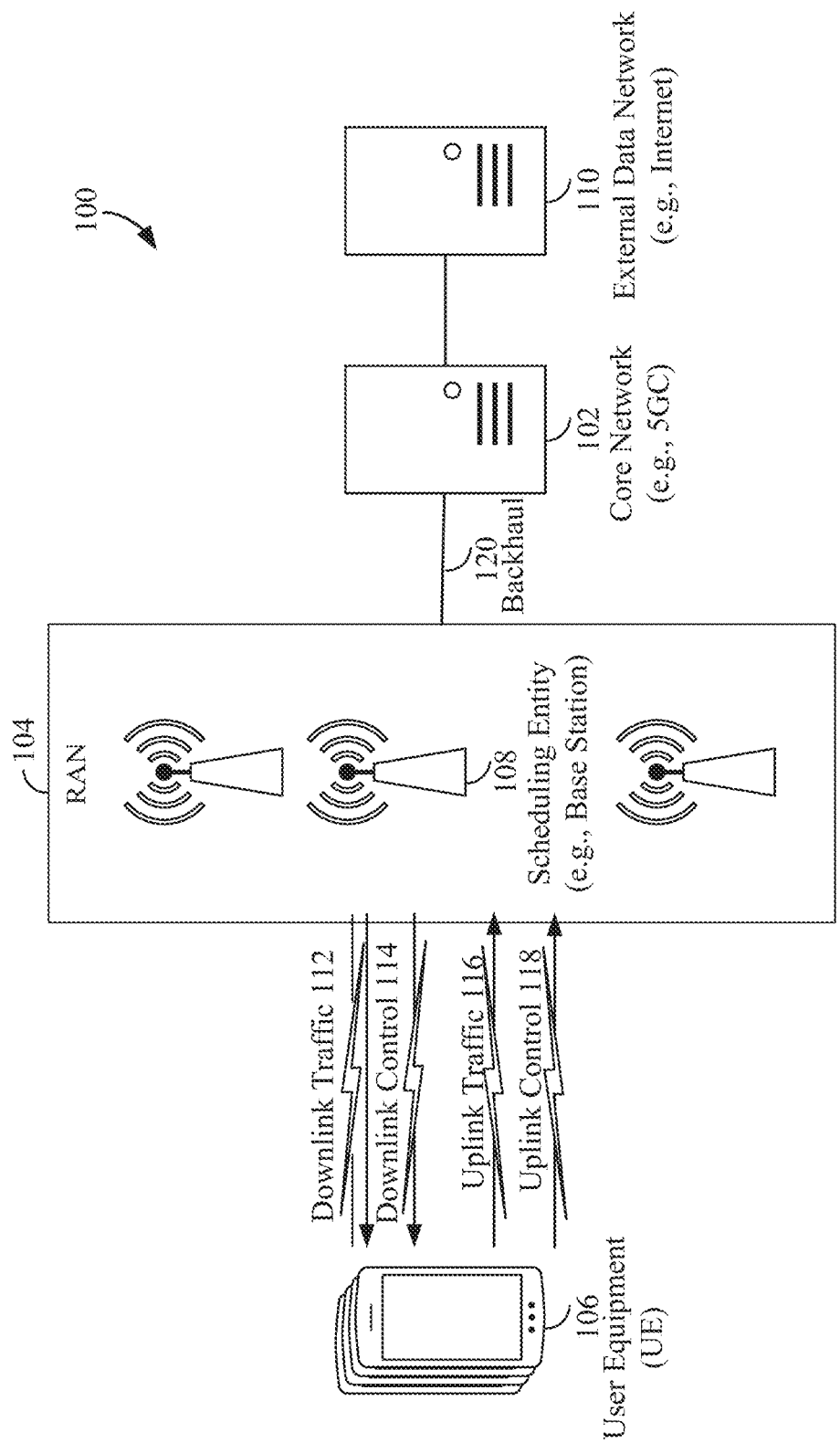
FIG. 1 illustrates an example of a wireless communication system.

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. In some instances, well known structures and components are shown in block diagram form in order to avoid obscuring such concepts.

Various aspects of the disclosure are described below. It should be apparent that the teachings herein may be embodied in a wide variety of forms and that any specific structure, function, or both being disclosed herein is merely representative. Based on the teachings herein one skilled in the art should appreciate that an aspect disclosed herein may be implemented independently of any other aspects and that two or more of these aspects may be combined in various ways. For example, an apparatus may be implemented or a method may be practiced using any number of the aspects set forth herein. In addition, such an apparatus may be implemented or such a method may be practiced using other structure, functionality, or structure and functionality in addition to or other than one or more of the aspects set forth herein. Furthermore, an aspect may comprise at least one element of a claim.

The techniques described herein may be applied to various broadband wireless communication systems, including communication systems that are based on an orthogonal multiplexing scheme. Examples of such communication systems include Spatial Division Multiple Access (SDMA) system, Time Division Multiple Access (TDMA) system, Orthogonal Frequency Division Multiple Access (OFDMA) system, and Single-Carrier Frequency Division Multiple Access (SC-FDMA) system. An SDMA system may utilize sufficiently different directions to simultaneously transmit data belonging to multiple user terminals. A TDMA system may allow multiple user terminals to share the same frequency channel by dividing the transmission signal into different time slots, each time slot being assigned to different user terminal An OFDMA system utilizes orthogonal frequency division multiplexing (OFDM), which is a modulation technique that partitions the overall system bandwidth into multiple orthogonal sub-carriers. These sub-carriers may also be called tones, bins, etc. With OFDM, each sub-carrier may be independently modulated with data. An SC-FDMA system may utilize interleaved FDMA (IFDMA)

to transmit on sub-carriers that are distributed across the system bandwidth, localized FDMA (LFDMA) to transmit on a block of adjacent sub-carriers, or enhanced FDMA (EFDMA) to transmit on multiple blocks of adjacent sub-carriers. In general, modulation symbols are sent in the frequency domain with OFDM and in the time domain with SC-FDMA.

The teachings herein may be incorporated into (e.g., implemented within or performed by) a variety of wired or wireless apparatuses (e.g., nodes). In some aspects, a wireless node implemented in accordance with the teachings herein may be an access point or an access terminal.

FIG. 1 illustrates an example of a wireless communication system 100. The wireless communication system 100 includes three interacting domains: a core network 102, a radio access network (RAN) 104, and a user equipment (UE) 106. By virtue of the wireless communication system 100, the UE 106 may be enabled to carry out data communication with an external data network 110, such as (but not limited to) the Internet.

The RAN 104 may implement any suitable wireless communication technology or technologies to provide radio access to the UE 106. As one example, the RAN 104 may operate according to 3rd Generation Partnership Project (3GPP) New Radio (NR) specifications, often referred to as 5G. As another example, the RAN 104 may operate under a hybrid of 5G NR and Evolved Universal Terrestrial Radio Access Network (eUTRAN) standards, often referred to as LTE. The 3GPP refers to this hybrid RAN as a next-generation RAN (NG-RAN). Of course, many other examples may be utilized, and are contemplated, within the scope of the present disclosure.

As illustrated, the RAN 104 includes a plurality of base stations 108. Broadly, a base station is a network element in a radio access network responsible for radio transmission and reception in one or more cells to or from a UE. In different technologies, standards, or contexts, a base station may variously be referred to by those skilled in the art as a base transceiver station (BTS), a radio base station, a radio transceiver, a transceiver function, a basic service set (BSS), an extended service set (ESS), an access point (AP), a Node B (NB), an eNode B (eNB), a gNode B (gNB), or some other suitable terminology.

The radio access network 104 is further illustrated supporting wireless communication for multiple mobile apparatuses. A mobile apparatus may be referred to as user equipment (UE) in 3GPP standards, but may also be referred to by those skilled in the art as a mobile station (MS), a subscriber station, a mobile unit, a subscriber unit, a wireless unit, a remote unit, a mobile device, a wireless device, a wireless communications device, a remote device, a mobile subscriber station, an access terminal (AT), a mobile terminal, a wireless terminal, a remote terminal, a handset, a terminal, a user agent, a mobile client, a client, or some other suitable terminology. A UE may be an apparatus that provides a user with access to network services.

Within the present document, a "mobile" apparatus need not necessarily have a capability to move, and may be stationary. The term mobile apparatus or mobile device broadly refers to a diverse array of devices and technologies. For example, some non-limiting examples of a mobile apparatus include a mobile, a cellular (cell) phone, a smart phone, a session initiation protocol (SIP) phone, a laptop, a personal computer (PC), a notebook, a netbook, a smart-book, a tablet, a personal digital assistant (PDA), and a broad array of embedded systems, e.g., corresponding to an "Internet of things" (IoT). A mobile apparatus may additionally be an automotive or other transportation vehicle, a remote sensor or actuator, a robot or robotics device, a satellite radio, a global positioning system (GPS) device, an object tracking device, a drone, a multi-copter, a quad-copter, a remote control device, a consumer and/or wearable device, such as eyewear, a wearable camera, a virtual reality device, a smart watch, a health or fitness tracker, a digital audio player (e.g., MP3 player), a camera, a game console, etc. A mobile apparatus may additionally be a digital home or smart home device such as a home audio, video, and/or multimedia device, an appliance, a vending machine, intelligent lighting, a home security system, a smart meter, etc. A mobile apparatus may additionally be a smart energy device, a security device, a solar panel or solar array, a municipal infrastructure device controlling electric power (e.g., a smart grid), lighting, water, etc.; an industrial automation and enterprise device; a logistics controller; agricultural equipment; military defense equipment, vehicles, aircraft, ships, and weaponry, etc. Still further, a mobile apparatus may provide for connected medicine or telemedicine support, i.e., health care at a distance. Telehealth devices may include telehealth monitoring devices and telehealth administration devices, whose communication may be given preferential treatment or prioritized access over other types of information, e.g., in terms of prioritized access for transport of critical service data, and/or relevant QoS for transport of critical service data.

Wireless communication between a RAN 104 and a UE 106 may be described as utilizing an air interface. Transmissions over the air interface from a base station (e.g., base station 108) to one or more UEs (e.g., UE 106) may be referred to as downlink (DL) transmission. In accordance with certain aspects of the present disclosure, the term downlink may refer to a point-to-multipoint transmission originating at a scheduling entity (described further below; e.g., base station 108). Another way to describe this scheme may be to use the term broadcast channel multiplexing. Transmissions from a UE (e.g., UE 106) to a base station (e.g., base station 108) may be referred to as uplink (UL) transmissions. In accordance with further aspects of the present disclosure, the term uplink may refer to a point-to-point transmission originating at a scheduled entity (described further below; e.g., UE 106).

In some examples, access to the air interface may be scheduled, wherein a scheduling entity (e.g., a base station 108) allocates resources for communication among some or all devices and equipment within its service area or cell. Within the present disclosure, as discussed further below, the scheduling entity may be responsible for scheduling, assigning, reconfiguring, and releasing resources for one or more scheduled entities. That is, for scheduled communication, UEs 106, which may be scheduled entities, may utilize resources allocated by the scheduling entity (e.g., base station 108).

Base stations 108 are not the only entities that may function as scheduling entities. That is, in some examples, a UE may function as a scheduling entity, scheduling resources for one or more other UEs (e.g., one or more scheduled entities).

As illustrated in FIG. 1, a scheduling entity (e.g., base stations 108) may broadcast downlink traffic 112 to one or more scheduled entities (e.g., UE 106). Broadly, the scheduling entity (e.g., base stations 108) is a node or device responsible for scheduling traffic in a wireless communication network, including the downlink traffic 112 and, in some examples, uplink traffic 116 from one or more scheduled entities (e.g., UE 106) to the scheduling entity (e.g., base station 108). On the other hand, the scheduled entity (e.g., UE 106) is a node or device that receives downlink control information 114, including but not limited to scheduling information (e.g., a grant), synchronization or timing information, or other control information from another entity in the wireless communication network such as the scheduling entity (e.g., base station 108).

In general, base stations 108 may include a backhaul interface for communication with a backhaul portion 120 of the wireless communication system. The backhaul 120 may provide a link between a base station 108 and the core network 102. Further, in some examples, a backhaul network may provide interconnection between the respective base stations 108. Various types of backhaul interfaces may be employed, such as a direct physical connection, a virtual network, or the like using any suitable transport network.

The core network 102 may be a part of the wireless communication system 100, and may be independent of the radio access technology used in the RAN 104. In some examples, the core network 102 may be configured according to 5G standards (e.g., 5GC). In other examples, the core network 102 may be configured according to a 4G evolved packet core (EPC), or any other suitable standard or configuration. 5G NR will operate across many radio frequency bands. The frequency bands include low bands (e.g., below 1 GHz) for long range in cooperation with mobile broadband and massive Internet of Things (IoT) operations. The low bands include spectrum bands around 600 MHz, 700 MHz, 850/900 MHz, for example. The frequency bands also include mid-bands that provide wider bandwidths than the low bands in cooperation with enhanced Mobile Broad Band (eMBB) and mission-critical operations. The mid-bands include, for example, spectrum between 1 to 6 GHz and include spectrum around 3.4-3.8 GHz, 3.8-4.2 GHz, and 4.4-4.9 GHz, for example. The frequency bands also include high bands (mmWave bands) with extreme bandwidths in spectrum around 24.25-27.5 GHz, 27.5.29.5, 37-40, 64-71 GHz, for example.

The 5G NR mmWave bands offer many advantages, and, as explained above, include disadvantages such as higher pathloss and/or susceptibility to interference. Consequently, HARQ transmissions encoded by a low-density parity-check (LDPC) code are used to improve throughput performance.

Communication of information, including the downlink traffic 112, downlink control 114, uplink traffic 116, and/or uplink control 118, may involve encoding and decoding information to enable reliable communication and/or error correction induced by a wireless channel. In one embodiment, LDPC codes are used to encode and decode data. In some cases, multiple transmissions corresponding to a specific transport block or other unit of information may be sent to allow the information to be received and decoded. For example, a hybrid automatic repeat request scheme may be used to send redundant transmissions corresponding to the same information (which may be referred to as redundancy versions). As discussed herein, each redundancy version sent by a transmitter (e.g., a UE 106 or a base station 108) may include self-decodable such that it is possible that a receiver (e.g., a UE 106 or a base station 108) can decode the full message based on any single redundancy version.

Figure 2:
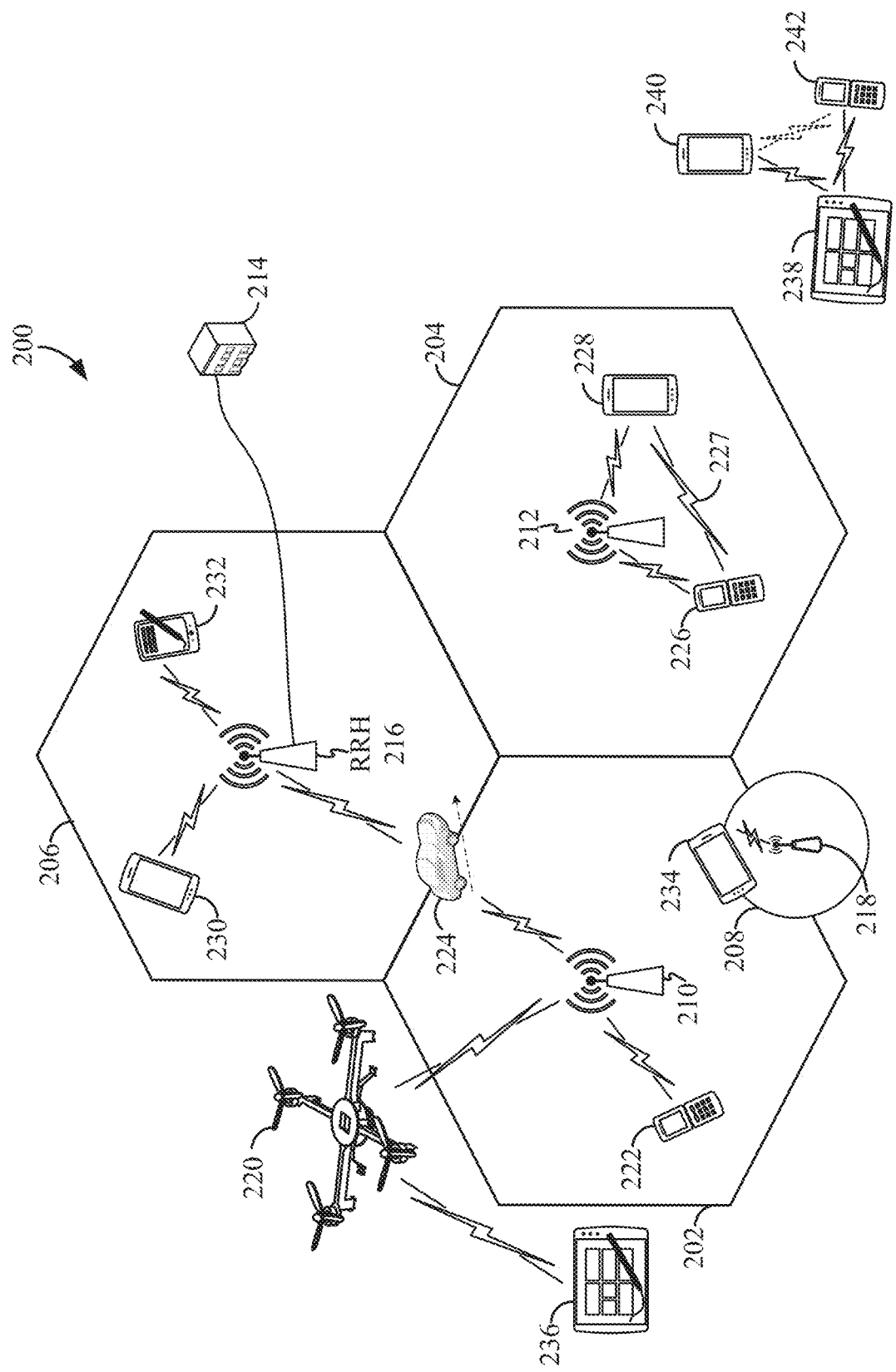
FIG. 2 illustrates an example of a schematic of a radio access network (RAN).

FIG. 2 illustrates an example of a schematic of a radio access network (RAN) 200. In some examples, the RAN 200 may be the same as the RAN 104 described above and illustrated in FIG. 1. The geographic area covered by the RAN 200 may be divided into cellular regions (cells) that can be uniquely identified by a user equipment (UE) based on an identification broadcasted from one access point or base station. FIG. 2 illustrates macrocells 202, 204, and 206, and a small cell 208, each of which may include one or more sectors (not shown). A sector is a sub-area of a cell. All sectors within one cell are served by the same base station. A radio link within a sector can be identified by a single logical identification belonging to that sector. In a cell that is divided into sectors, the multiple sectors within a cell can be formed by groups of antennas with each antenna responsible for communication with UEs in a portion of the cell.

In FIG. 2, two base stations 210 and 212 are shown in cells 202 and 204; and a third base station 214 is shown controlling a remote radio head (RRH) 216 in cell 206. That is, a base station can have an integrated antenna or can be connected to an antenna or RRH by feeder cables. In the illustrated example, the cells 202, 204, and 126 may be referred to as macrocells, as the base stations 210, 212, and 214 support cells having a large size. Further, a base station 218 is shown in the small cell 208 (e.g., a microcell, picocell, femtocell, home base station, home Node B, home eNode B, etc.) which may overlap with one or more macrocells. In this example, the cell 208 may be referred to as a small cell, as the base station 218 supports a cell having a relatively small size. Cell sizing can be done according to system design as well as component constraints.

It is to be understood that the radio access network 200 may include any number of wireless base stations and cells. Further, a relay node may be deployed to extend the size or coverage area of a given cell. The base stations 210, 212, 214, 218 provide wireless access points to a core network for any number of mobile apparatuses. In some examples, the base stations 210, 212, 214, and/or 218 may be the same as the base station 108 (e.g., scheduling entity) described above and illustrated in FIG. 1.

FIG. 2 further illustrates a quadcopter or drone 220, which may be configured to function as a base station. That is, in some examples, a cell may not necessarily be stationary, and the geographic area of the cell may move according to the location of a mobile base station such as the quadcopter 220.

Within the RAN 200, the cells may include UEs that may be in communication with one or more sectors of each cell. Further, each base station 210, 212, 214, 218, and 220 may be configured to provide an access point to a core network 102 (see FIG. 1) for all the UEs in the respective cells. For example, UEs 222 and 224 may be in communication with base station 210; UEs 226 and 228 may be in communication with base station 212; UEs 230 and 232 may be in communication with base station 214 by way of RRH 216; UE 234 may be in communication with base station 218; and UE 236 may be in communication with mobile base station 220. In some examples, the UEs 222, 224, 226, 228, 230, 232, 234, 236, 238, 240, and/or 242 may be the same as the UE 106 (e.g., scheduled entity) described above and illustrated in FIG. 1. In some examples, some of the UEs may be a vehicle or automobile (e.g., UE 224).

In some examples, a mobile network node (e.g., quadcopter 220 or vehicle 224) may be configured to function as a UE. For example, the quadcopter 220 may operate within cell 202 by communicating with base station 210.

In a further aspect of the RAN 200, sidelink signals may be used between UEs without necessarily relying on scheduling or control information from a base station. For example, two or more UEs (e.g., UEs 226 and 228) may communicate with each other using peer to peer (P2P) or sidelink signals 227 without relaying that communication through a base station (e.g., base station 212). In a further example, UE 238 is illustrated communicating with UEs 240 and 242. Here, the UE 238 may function as a scheduling entity or a primary sidelink device, and UEs 240 and 242 may function as a scheduled entity or a non-primary (e.g., secondary) sidelink device. In still another example, a UE may function as a scheduling entity in a device-to-device (D2D), peer-to-peer (P2P), or vehicle-to-vehicle (V2V) network, and/or in a mesh network. In a mesh network example, UEs 240 and 242 may optionally communicate directly with one another in addition to communicating with the scheduling entity 238. Thus, in a wireless communication system with scheduled access to time-frequency resources and having a cellular configuration, a P2P configuration, or a mesh configuration, a scheduling entity and one or more scheduled entities may communicate utilizing the scheduled resources.

In the radio access network 200, the ability for a UE (e.g., vehicle 224) to communicate while moving, independent of its location, is referred to as mobility. The various physical channels between the UE and the radio access network are generally set up, maintained, and released under the control of an access and mobility management function (AMF, not illustrated, part of the core network 102 in FIG. 1), which may include a security context management function (SCMF) that manages the security context for both the control plane and the user plane functionality, and a security anchor function (SEAF) that performs authentication.

In various aspects of the disclosure, a radio access network 200 may utilize DL-based mobility or UL-based mobility to enable mobility and handovers (i.e., the transfer of a UE's connection from one radio channel to another or from one base station to another). In a network configured for DL-based mobility, during a call with a scheduling entity, or at any other time, a UE may monitor various parameters of the signal from its serving cell as well as various parameters of neighboring cells. Depending on the quality of these parameters, the UE may maintain communication with one or more of the neighboring cells. During this time, if the UE moves from one cell to another, or if signal quality from a neighboring cell exceeds that from the serving cell for a given amount of time, the UE may undertake a handoff or handover from the serving cell to the neighboring (target) cell. For example, UE 224 (illustrated as a vehicle, although any suitable form of UE may be used) may move from the geographic area corresponding to its serving cell 202 to the geographic area corresponding to a neighbor cell 206. When the signal strength or quality from the neighbor cell 206 exceeds that of its serving cell 202 for a given amount of time, the UE 224 may transmit a reporting message to its serving base station 210 indicating this condition. In response, the UE 224 may receive a handover command, and the UE may undergo a handover to the cell 206.

In a network configured for UL-based mobility, UL reference signals from each UE may be utilized by the network to select a serving cell for each UE. In some examples, the base stations 210, 212, and 214/216 may broadcast unified synchronization signals (e.g., unified Primary Synchronization Signals (PSSs), unified Secondary Synchronization Signals (SSSs) and unified Physical Broadcast Channels (PBCH)). The UEs 222, 224, 226, 228, 230, and 232 may receive the unified synchronization signals, derive the carrier frequency and slot timing from the synchronization signals, and in response to deriving timing, transmit an uplink pilot or reference signal. The uplink pilot signal transmitted by a UE (e.g., UE 224) may be concurrently received by two or more cells (e.g., base stations 210 and 214/216) within the radio access network 200. Each of the cells may measure a strength of the pilot signal, and the radio access network (e.g., one or more of the base stations 210 and 214/216 and/or a central node within the core network) may determine a serving cell for the UE 224. As the UE 224 moves through the radio access network 200, the network may continue to monitor the uplink pilot signal transmitted by the UE 224. When the signal strength or quality of the pilot signal measured by a neighboring cell exceeds that of the signal strength or quality measured by the serving cell, the network 200 may handover the UE 224 from the serving cell to the neighboring cell, with or without informing the UE 224.

Although the synchronization signal transmitted by the base stations 210, 212, and 214/216 may be unified, the synchronization signal may not identify a particular cell, but rather may identify a zone of multiple cells operating on the same frequency and/or with the same timing. The use of zones in 5G networks or other next generation communication networks enables the uplink-based mobility framework and improves the efficiency of both the UE and the network, since the number of mobility messages that need to be exchanged between the UE and the network may be reduced.

In various implementations, the air interface in the radio access network 200 may utilize licensed spectrum, unlicensed spectrum, or shared spectrum. Licensed spectrum provides for exclusive use of a portion of the spectrum, generally by virtue of a mobile network operator purchasing a license from a government regulatory body. Unlicensed spectrum provides for shared use of a portion of the spectrum without need for a government-granted license. While compliance with some technical rules is generally still required to access unlicensed spectrum, generally, any operator or device may gain access. Shared spectrum may fall between licensed and unlicensed spectrum, wherein technical rules or limitations may be required to access the spectrum, but the spectrum may still be shared by multiple operators and/or multiple RATs. For example, the holder of a license for a portion of licensed spectrum may provide licensed shared access (LSA) to share that spectrum with other parties, e.g., with suitable licensee-determined conditions to gain access.

The air interface in the radio access network 200 may utilize one or more duplexing algorithms. Duplex refers to a point-to-point communication link where both endpoints can communicate with one another in both directions. Full duplex means both endpoints can simultaneously communicate with one another. Half duplex means only one endpoint can send information to the other at a time. In a wireless link, a full duplex channel generally relies on physical isolation of a transmitter and receiver, and suitable interference cancellation technologies. Full duplex emulation is frequently implemented for wireless links by utilizing frequency division duplex (FDD) or time division duplex (TDD). In FDD, transmissions in different directions operate at different carrier frequencies. In TDD, transmissions in different directions on a given channel are separated from one another using time division multiplexing. That is, at some times the channel is dedicated for transmissions in one direction, while at other times the channel is dedicated for transmissions in the other direction, where the direction may change very rapidly, e.g., several times per slot.

In order for transmissions over the radio access network 200 to obtain a low block error rate (BLER) while still achieving very high data rates, channel coding may be used. That is, wireless communication may generally utilize a suitable error correcting block code. In a typical block code, an information message or sequence is split up into code blocks (CBs), and an encoder (e.g., a CODEC) at the transmitting device then mathematically adds redundancy to the information message. Exploitation of this redundancy in the encoded information message can improve the reliability of the message, enabling correction for any bit errors that may occur due to the noise.

By way of example, user data may be coded using quasi-cyclic low-density parity check (LDPC) with two different base graphs: one base graph is used for large code blocks and/or high code rates, while the other base graph is used otherwise. Control information and the physical broadcast channel (PBCH) are coded using polar coding, based on nested sequences. For these channels, puncturing, shortening, and repetition are used for rate matching.

However, those of ordinary skill in the art will understand that aspects of the present disclosure may be implemented utilizing any suitable channel code. Various implementations of scheduling entities (e.g., base station 108) and scheduled entities (e.g., UE 106) may include suitable hardware and capabilities (e.g., an encoder, a decoder, and/or a CODEC) to utilize one or more of these channel codes for wireless communication.

The air interface in the radio access network 200 may utilize one or more multiplexing and multiple access algorithms to enable simultaneous communication of the various devices. An examples of multiple access may include multiple access for UL transmissions from UEs 222 and 224 to base station 210, and for multiplexing for DL transmissions from base station 210 to one or more UEs 222 and 224, utilizing orthogonal frequency division multiplexing (OFDM) with a cyclic prefix (CP). In addition, for UL transmissions, discrete Fourier transform-spread-OFDM (DFT-s-OFDM) with a CP (also referred to as single-carrier FDMA (SC-FDMA)) may be used. However, within the scope of the present disclosure, multiplexing and multiple access are not limited to the above schemes, and may be provided utilizing time division multiple access (TDMA), code division multiple access (CDMA), frequency division multiple access (FDMA), sparse code multiple access (SCMA), resource spread multiple access (RSMA), or other suitable multiple access schemes. Further, multiplexing DL transmissions from the base station 210 to UEs 222 and 224 may be provided utilizing time division multiplexing (TDM), code division multiplexing (CDM), frequency division multiplexing (FDM), orthogonal frequency division multiplexing (OFDM), sparse code multiplexing (SCM), or other suitable multiplexing schemes.

Figure 3:
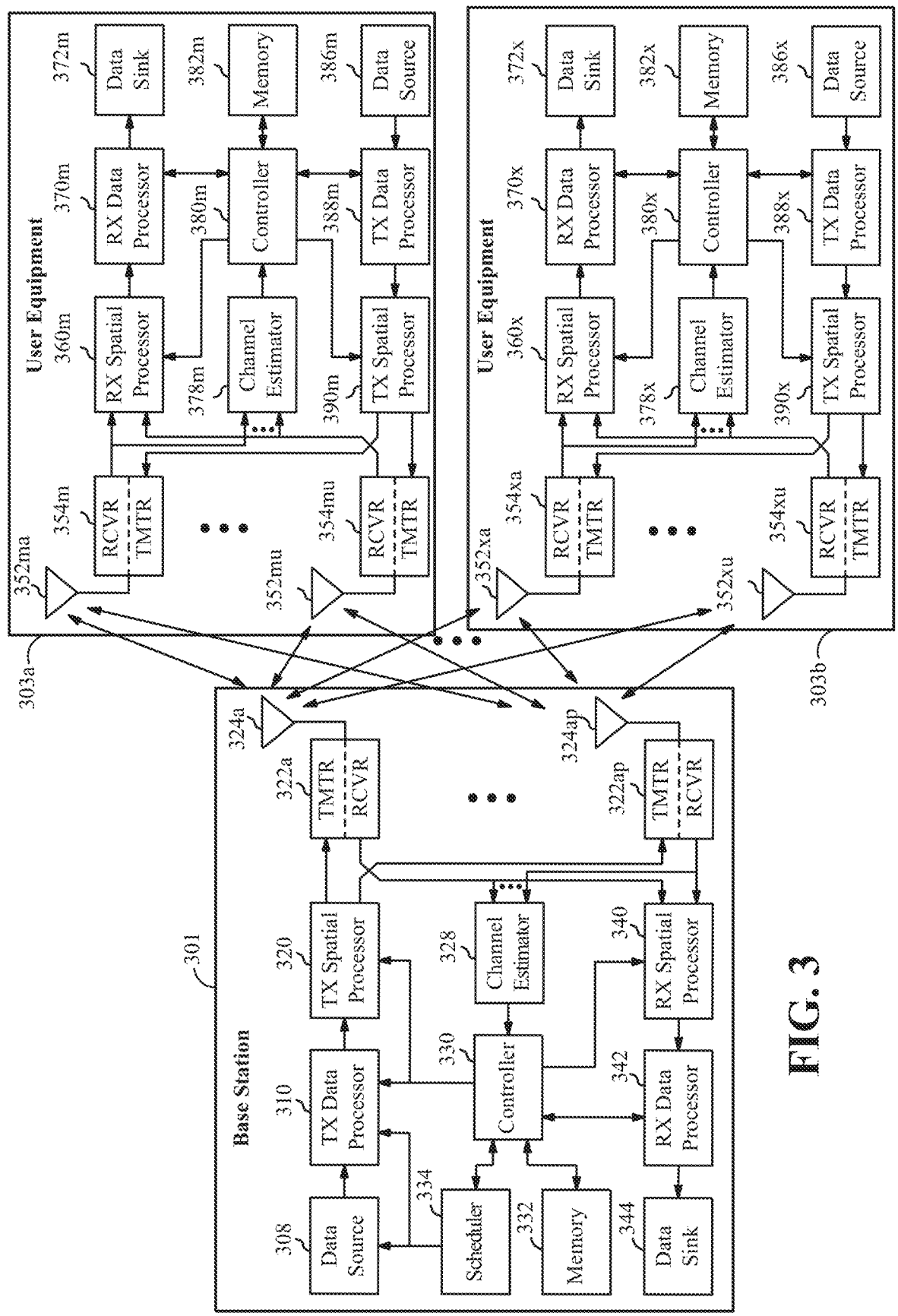
FIG. 3 illustrates an example block diagram of a base station and a plurality of user equipment (UEs).

FIG. 3 illustrates an example block diagram of a base station and a plurality of UEs 303a and 303b. In this example, the base station 301 may be equipped with $N_t$ antennas 324a through 324ap. A first UE 303a may be equipped with one or more $N_{ut,m}$ antennas 352ma through 352mu, and a second UE 303b may be equipped with one or more $N_{ut,x}$ antennas 352xa through 352xu. In accordance with the explanation provided above, the base station 301 may be a transmitting entity for the DL and a receiving entity for the UL. Each UE 303a and 303b may be a transmitting entity for the UL and a receiving entity for the DL. As used herein, a "transmitting entity" is an independently operated apparatus or device capable of transmitting data using a wireless channel, and a "receiving entity" is an independently operated apparatus or device capable of receiving data using a wireless channel. In the following description, the subscript "dn" denotes the DL, the subscript "up" denotes the UL, $N_{up}$ UEs are selected for simultaneous transmission on the UL, $N_{dn}$ UEs are selected for simultaneous transmission on the DL, $N_{up}$ may or may not be equal to $N_{dn}$, and $N_{up}$ and $N_{dn}$ may be static values or can change for each scheduling interval. The beam-steering or some other spatial processing technique may be used at the base station 301 and/or UEs 303a and 303b.

On the UL, at each UE 303a and 303b selected for uplink transmission, a transmit (TX) data processor 388 receives traffic data from a data source 386 and control data from a controller 380. The controller 380 may be coupled with a memory 382. TX data processor 388 processes (e.g., encodes, interleaves, and modulates) the traffic data for the UE based on the coding and modulation schemes associated with the rate selected for the UE and provides a data symbol stream. A TX spatial processor 390 performs spatial processing on the data symbol stream and provides $N_{ut,m}$ transmit symbol streams for the $N_{ut,m}$ antennas. Each transmitter unit (TMTR) 354 receives and processes (e.g., converts to analog, amplifies, filters, and frequency upconverts) a respective transmit symbol stream to generate an uplink signal. $N_{ut,m}$ transmitter units 354 provide $N_{ut,m}$ uplink signals for transmission from $N_{ut,m}$ antennas 352 to the base station 301.

Up to $N_{up}$ UEs may be scheduled for simultaneous transmission on the uplink. Each of these UEs may perform spatial processing on its data symbol stream and transmits its set of transmit symbol streams on the uplink to the base station.

At the base station 301, $N_{ap}$ antennas 324a through 324ap receive the uplink signals from all $N_{up}$ UEs transmitting on the uplink. Each antenna 324 provides a received signal to a respective receiver unit (RCVR) 322. Each receiver unit 322 performs processing complementary to that performed by transmitter unit 354 and provides a received symbol stream. An RX spatial processor 340 performs receiver spatial processing on the $N_{ap}$ received symbol streams from $N_{ap}$ receiver units 322 and provides $N_{up}$ recovered uplink data symbol streams. The receiver spatial processing is performed in accordance with the channel correlation matrix inversion (CCMI), minimum mean square error (MMSE), soft interference cancellation (SIC), or some other technique. Each recovered uplink data symbol stream is an estimate of a data symbol stream transmitted by a respective UE. An RX data processor 342 processes (e.g., demodulates, deinterleaves, and decodes) each recovered uplink data symbol stream in accordance with the rate used for that stream to obtain decoded data. The decoded data for each UE 303a and 303b may be provided to a data sink 344 for storage and/or a controller 330 for further processing. The controller 330 may be coupled with a memory 332.

On the downlink, at the base station 301, a TX data processor 310 receives traffic data from a data source 308 for $N_{dn}$ UEs scheduled for downlink transmission, control data from a controller 330, and possibly other data from a scheduler 334. The various types of data may be sent on different transport channels. TX data processor 310 processes (e.g., encodes, interleaves, and modulates) the traffic data for each UE based on the rate selected for that UE. The TX data processor 310 provides $N_{dn}$ downlink data symbol streams for the $N_{dn}$ UEs. A TX spatial processor 320 performs spatial processing (such as a precoding or beamforming, as described in the present disclosure) on the $N_{dn}$ downlink data symbol streams, and provides $N_{ap}$ transmit symbol streams for the $N_{ap}$ antennas. Each transmitter unit 322 receives and processes a respective transmit symbol stream to generate a downlink signal. $N_{ap}$ transmitter units 322 providing $N_{ap}$ downlink signals for transmission from $N_{ap}$ antennas 324 to the UEs. The decoded data for each UE may be provided to a data sink 372 for storage and/or a controller 380 for further processing.

At each UE, one or more $N_{ut,m}$ antennas 352 receive the $N_{ap}$ downlink signals from the base station 301. Each receiver unit 354 processes a received signal from an associated antenna 352 and provides a received symbol stream. An RX spatial processor 360 performs receiver spatial processing on $N_{ut,m}$ received symbol streams from $N_{ut,m}$ receiver units 354 and provides a recovered downlink data symbol stream for the UE. The receiver spatial processing is performed in accordance with the CCMI, MMSE or some other technique. An RX data processor 370 processes (e.g., demodulates, deinterleaves and decodes) the recovered downlink data symbol stream to obtain decoded data for the UE.

At each UE 303, a channel estimator 378 estimates the downlink channel response and provides downlink channel estimates, which may include channel gain estimates, signal-to-noise ratio (SNR) estimates, noise variance and so on. Similarly, at the base station 301, a channel estimator 328 estimates the uplink channel response and provides uplink channel estimates. The controller 380 for each UE typically derives the spatial filter matrix for the UE based on the downlink channel response matrix $H_{dn,m}$ for that UE. The controller 330 derives the spatial filter matrix for the base station based on the effective uplink channel response matrix $H_{up,eff}$. The controller 380 for each UE may send feedback information (e.g., the downlink and/or uplink eigenvectors, eigenvalues, SNR estimates, and so on) to the base station. The controllers 330 and 380 also control the operation of various processing units at base station 301 and UE 303, respectively.

While portions of the present disclosure describe the UEs 303 capable of communicating using multiple input multiple output (MIMO) techniques, for certain aspects the UEs 303 may also include some UEs that do not support MIMO. Thus, for such aspects, the base station 301 may be configured to communicate with both MIMO and non-MIMO UEs. This approach may conveniently allow older versions of UEs, known as "legacy" UEs, to remain deployed in an enterprise, extending their useful lifetime while allowing newer MIMO UEs to be introduced as deemed appropriate.

A frame structure may be used for data transmission between wireless stations such as a transmitter station and a receiver station. In one aspect, a frame structure in a Media Access Control (MAC) layer and a physical (PHY) layer is utilized, wherein in a transmitter station, a MAC layer receives a MAC Service Data Unit (MSDU) and attaches a MAC header thereto, in order to construct a MAC Protocol Data Unit (MPDU). The MAC header includes information such as a source address (SA) and a destination address (DA). The MPDU is a part of a PHY Service Data Unit (PSDU) and is transferred to a PHY layer in the transmitter to attach a PHY header (i.e., PHY preamble) thereto to construct a PHY Protocol Data Unit (PPDU). The PHY header includes parameters for determining a transmission scheme including a coding/modulation scheme. The PHY layer includes transmission hardware for transmitting data bits over a wireless link. Before transmission as a frame from the transmitter station to the receiver station, a preamble is attached to the PPDU, wherein the preamble can include channel estimation and synchronization information.

Figure 4:
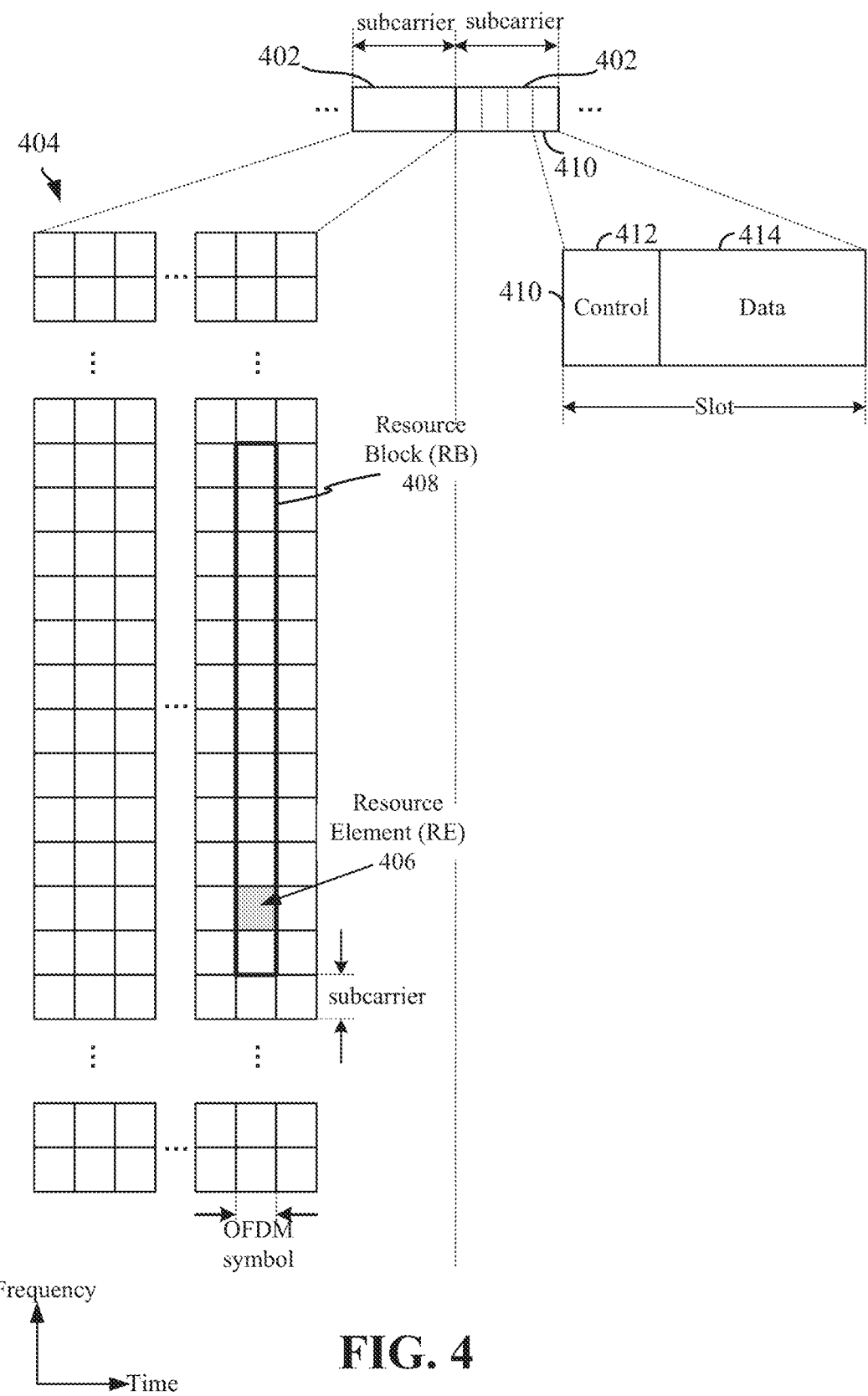
FIG. 4 illustrates a schematic of an example of an Orthogonal Frequency Division Multiplexing (OFDM) waveform frame structure.

FIG. 4 illustrates a schematic of an example of an OFDM waveform frame structure. It should be understood by those of ordinary skill in the art that the various aspects of the present disclosure may be applied to a DFT-s-OFDMA waveform in substantially the same way as described herein below. That is, while some examples of the present disclosure may focus on an OFDM link for clarity, it should be understood that the same principles may be applied as well to DFT-s-OFDMA waveforms.

Within the present disclosure, a frame may refer to a duration of 10 ms for wireless transmissions, with each frame consisting of 10 subframes of 1 ms each. On a given carrier, there may be one set of frames in the UL, and another set of frames in the DL. Referring now to FIG. 4, an expanded view of an example DL subframe 402 is illustrated, showing an OFDM resource grid 404. However, as those skilled in the art will readily appreciate, the PHY transmission structure for any particular application may vary from the example described here, depending on any number of factors. Here, time is in the horizontal direction with units of OFDM symbols; and frequency is in the vertical direction with units of subcarriers or tones.

The resource grid 404 is divided into multiple resource elements (REs) 406. An RE, which is 1 subcarrier×1 symbol, is the smallest discrete part of the time-frequency grid, and contains a single complex value representing data from a physical channel or signal. Depending on the modulation utilized in a particular implementation, each RE may represent one or more bits of information or parity bits. In some examples, a block of REs may be referred to as a physical resource block (PRB) or more simply a resource block (RB) 408, which contains any suitable number of consecutive subcarriers in the frequency domain. In one example, an RB may include 12 subcarriers, or another number independent of the numerology used. In some examples, depending on the numerology, an RB may include any suitable number of consecutive OFDM symbols in the time domain.

A UE generally utilizes only a subset of the resource grid 404. An RB may be the smallest unit of resources that can be allocated to a UE. Thus, the more RBs scheduled for a UE, and the higher the modulation scheme chosen for the air interface, the higher the data rate for the UE. In this illustration, the RB 408 is shown as occupying less than the entire bandwidth of the subframe 402, with some subcarriers illustrated above and below the RB 408.

Each 1 millisecond (ms) subframe 402 may consist of one or multiple adjacent slots. In the example shown in FIG. 4, one subframe 402 includes four slots 410, as an illustrative example. In some examples, a slot may be defined according to a specified number of OFDM symbols with a given cyclic prefix (CP) length. For example, a slot may include 7 or 14 OFDM symbols with a nominal CP. Additional examples may include mini-slots having a shorter duration (e.g., one or two OFDM symbols). These mini-slots may in some cases be transmitted occupying resources scheduled for ongoing slot transmissions for the same or for different UEs.

An expanded view of one of the slots 410 illustrates the slot 410 including a control region 412 and a data region 414. In general, the control region 412 may carry control channels (e.g., a physical downlink control channel), and the data region 414 may carry data channels (e.g., physical downlink shared channel or physical uplink shared channel). Of course, a slot may contain all DL, all UL, or at least one DL portion and at least one UL portion. The simple structure illustrated in FIG. 4 is merely example in nature, and different slot structures may be utilized, and may include one or more of each of the control region(s) and data region(s).

Although not illustrated in FIG. 4, the various REs 406 within a RB 408 may be scheduled to carry one or more physical channels, including control channels, shared channels, data channels, etc. For example, one or more control channels may be used for scheduling and controlling ranging operations between UEs. Other REs 406 within the RB 408 may also carry pilots or reference signals, including but not limited to a demodulation reference signal (DMRS) a control reference signal (CRS), or a sounding reference signal (SRS). These pilots or reference signals may provide for a receiving device to perform channel estimation of the corresponding channel, which may enable coherent demodulation/detection of the control and/or data channels within the RB 408.

The channels or carriers described above and illustrated in FIGS. 1-4 are not necessarily all the channels or carriers that may be utilized between a scheduling entity 108 and scheduled entities 106, and those of ordinary skill in the art will recognize that other channels or carriers may be utilized in addition to those illustrated, such as other traffic, control, and feedback channels.

These physical channels described above are generally multiplexed and mapped to transport channels for handling at the medium access control (MAC) layer. Transport channels carry blocks of information called transport blocks (TB). The transport block size (TBS), which may correspond to a number of bits of information, may be a controlled parameter, based on the modulation and coding scheme (MCS) and the number of RBs in a given transmission.

Since transmissions over a wireless channel are often susceptible to interference which may result in errors to the transmissions, techniques to reduce such errors and/or help recover affected data/information in the transmissions are desirable.

As mentioned previously, channel coding may help improve reliable communication and error detection. Various aspects provide methods and apparatus for self-decodability of HARQ transmissions that are encoded using a low-density parity-check (LDPC) code. A plurality of bits N are encoded using an LDPC code that employs a quasi-cyclic lifting structure, which is a sparse bipartite graph (also referred to as a base graph). The encoded bits may result into a first set of bits encoded with a core (systematic) part of the base graph which are referred to as core or systematic bits, and a second set of bits encoded with a non-core (parity) part of the base graph which are referred to as non-core or parity bits. In some implementations, the core (systematic) part of the base graph may be more densely populated than the non-core (parity) part of the graph. After puncturing of the encoded bits, the resulting encoded bits are transmitted from a circular buffer according to a first redundancy version order. However, if a retransmission is required, then the first set of bits (i.e., core or systematic bits) are reordered (e.g., using an interleaver). The second set of bits (non-core or parity bits) are not reordered. After reordering of the first set of bits, some of the reordered resulting encoded bits are transmitted from a circular buffer according to a second redundancy version. By modifying or reordering the core or systematic bits and transmitting some of them (e.g., a subset of all reordered bits), a probability that the second redundancy version will be self-decodable by a receiver is improved. If additional retransmissions are needed, the reordered first set of bits (core or systematic bits) may be used and some of them transmitted according to a different redundancy version.

Transmissions over a channel are often susceptible to interference or fading which may result in errors to the transmissions. Various techniques have been employed to reduce such errors and/or help recover affected data/information in the transmissions. For instance, turbo codes have been used in many modern cellular systems for forward error correction (FEC). In some technologies, low-density parity-check (LDPC) codes for forward error correction are used. A low-density parity-check (LDPC) code (also known as a Galleger code) is a linear error correcting code constructed using a sparse bipartite graph. LDPC codes may allow for high throughput. Additionally, channel coding may also need to support incremental-redundancy hybrid automatic repeat request (HARQ), and a wide range of block lengths and coding rates, with stringent performance guarantees and minimal overhead complexity. HARQ are used to ensure high transmission reliability.

Hybrid automatic repeat request (hybrid ARQ or HARQ) is a combination of high-rate forward error-correcting coding and ARQ error-control. In standard ARQ, redundant bits are added to data to be transmitted using an error-detecting (ED) code such as a cyclic redundancy check (CRC). Receivers detecting a corrupted message can request a new message from the sender. In HARQ, the original data is encoded with a forward error correction (FEC) code, and the parity bits are either immediately sent along with the message or only transmitted upon request when a receiver detects an erroneous message. The ED code may be omitted when a code is used that can perform both forward error correction (FEC) in addition to error detection, such as a Reed-Solomon code. The FEC code is chosen to correct an expected subset of all errors that may occur, while the ARQ method is used as a fall-back to correct errors that are uncorrectable using only the redundancy sent in the initial transmission. As a result, HARQ may perform better than ARQ in poor signal conditions, but may come at the expense of significantly lower throughput in good signal conditions. There is sometimes a signal quality crossover point below which simple HARQ is better, and above which basic ARQ is better.

Figure 5:
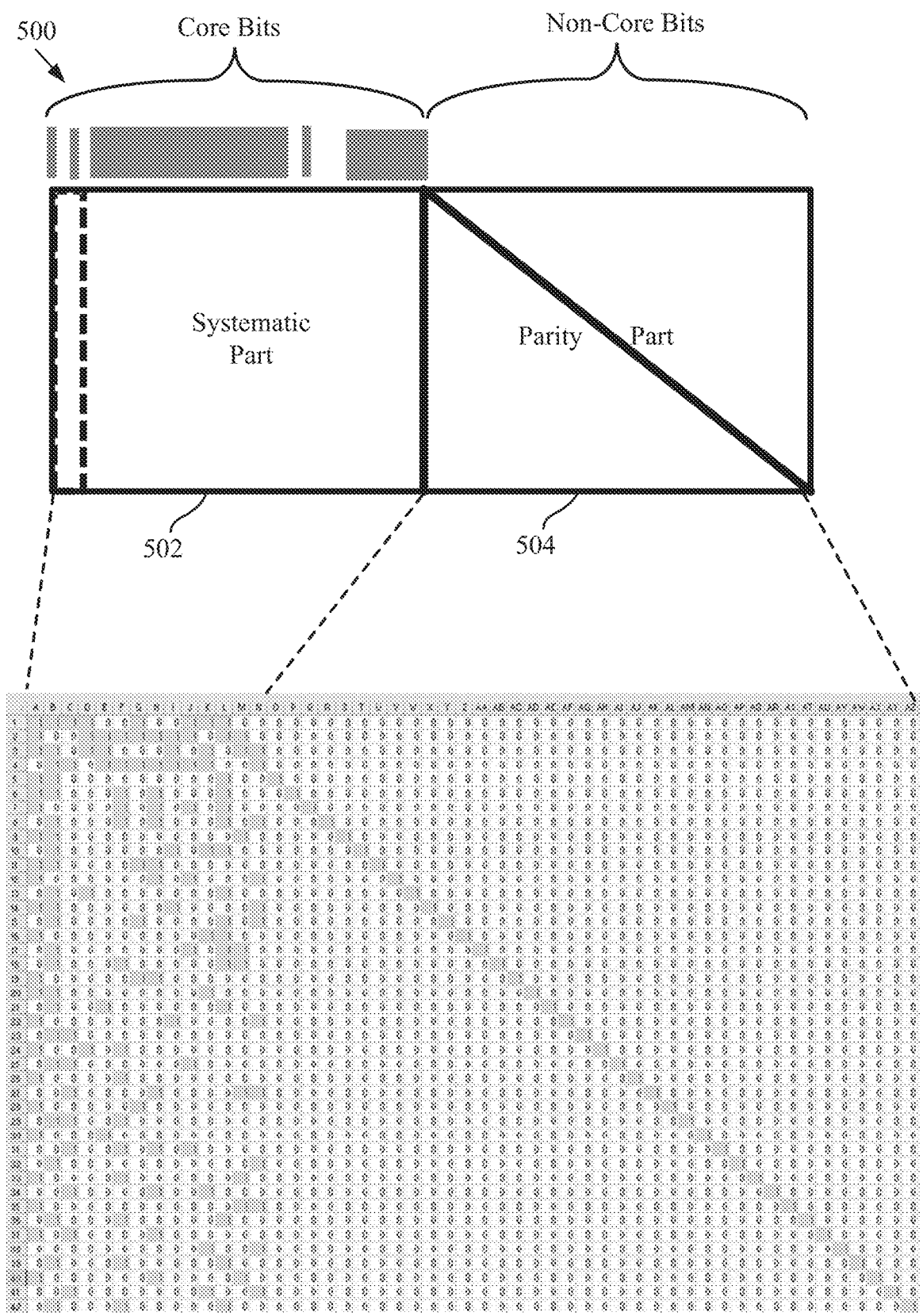
FIG. 5 is an example matrix illustrating a 5G new radio (NR) low-density parity-check (LDPC) code structure using a sparse bipartite graph comprising a systematic part and a parity part.

FIG. 5 is an example matrix illustrating a 5G NR LDPC code structure using a sparse bipartite graph 500 (e.g., base graph) comprising a systematic part 502 and a parity part 504. The NR LDPC code employs quasi-cyclic lifting structure (e.g., a base graph) which enables parallel decoding. The core or systematic part 502 (also referred to as nodes with a degree greater than 1) is denser than the non-core or parity part 504. The core part 502 may be identified based on the presence of more than one non-zero value per column while the non-core part or parity part includes some columns with only one non-zero value. The non-core or parity part 504 (also referred to as nodes with a degree 1 extension) facilitates flexible HARQ transmission. In one example, the graph 500 may have 42 rows and 52 columns, with 10 columns being for the core or systematic part and 38 columns being for the non-core or parity part.

Although FIG. 5 illustrates a matrix which may be used to decode a message received via a channel, the matrix sufficiently defines the corresponding LDPC code such that an encoding or generator matrix may be determined for use during an encoding operation. The matrix may be predefined such that both a transmitter and a receiver encode and decode signals in accordance with a common LDPC code.

Figure 6:
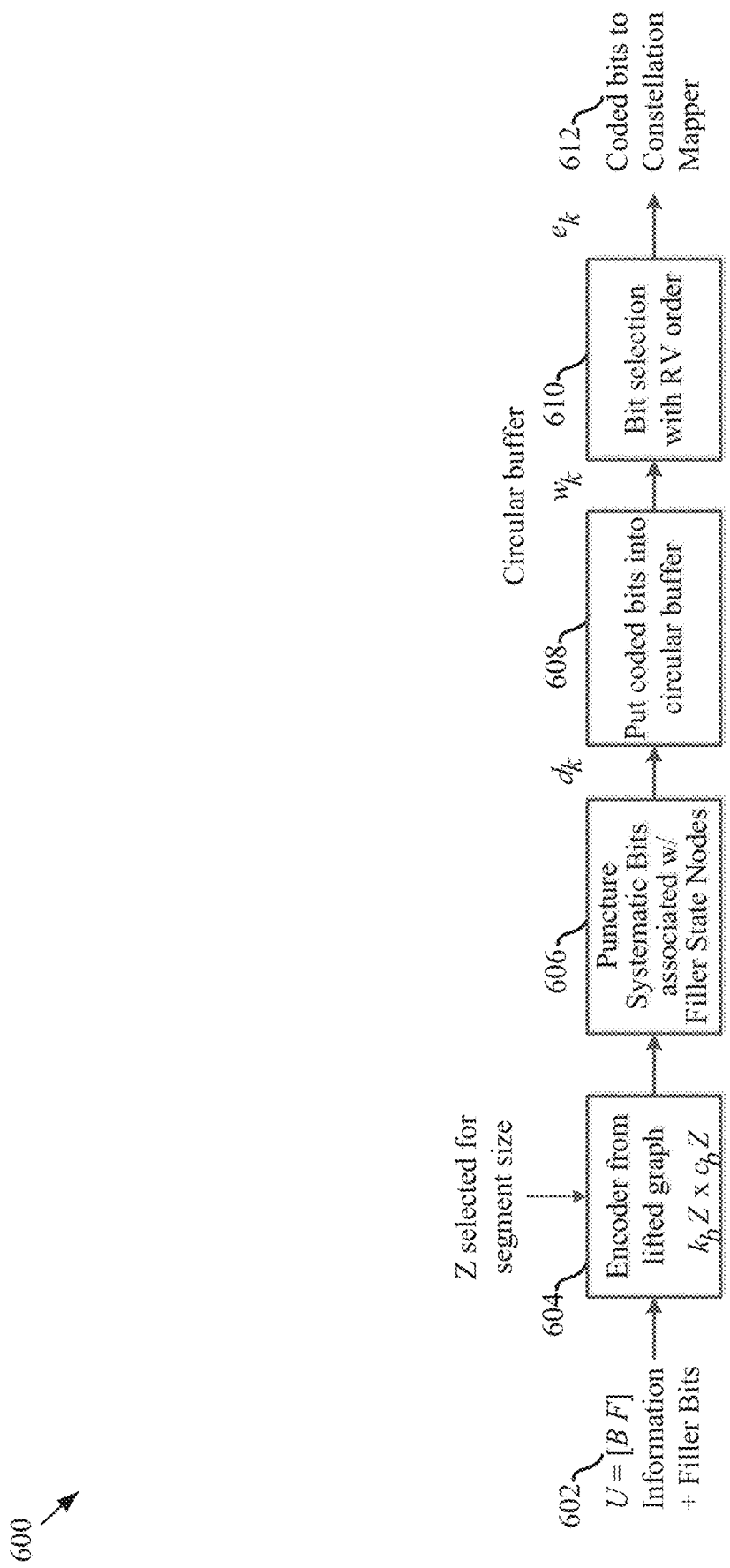
FIG. 6 is a block diagram illustrating an example of a hybrid automatic repeat request (HARQ) transmission process using a low-density parity-check (LDPC) code.

FIG. 6 is a block diagram illustrating an example of a HARQ transmission process using a low-density parity-check (LDPC) code. Information and filler bits 602 are encoded 604 based on the sparse bipartite graph 500 (e.g., base graph). Puncturing is then applied to the encoded bits to remove some parity bits 606. The coded bits are then placed into a circular buffer 608. Bits are then selected according to a redundancy version order (RV) 610 and sent to a constellation mapper 612 in preparation for transmission.

Figure 7:
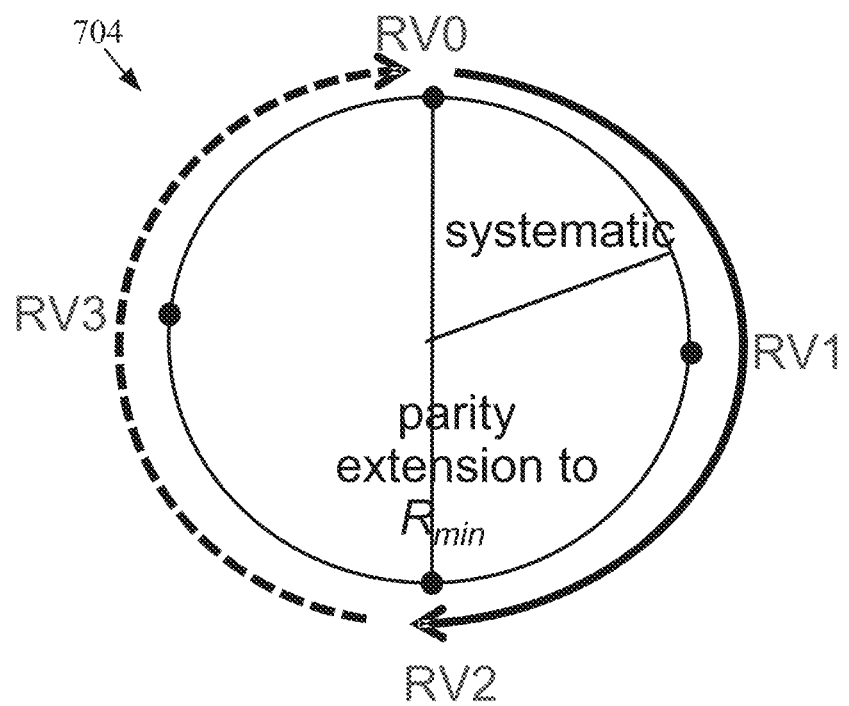
FIG. 7 illustrates an example of a circular buffer and redundancy version order for a HARQ transmission.

FIG. 7 illustrates an example of a circular buffer 704 and redundancy version order 702 for a HARQ transmission. In this example, four (4) redundancy version (RV) orders 702 are defined, with a maximum of 4 transmissions. Each redundancy version order may start at a different column of the sparse bipartite graph 500. A RV order defines the starting position (e.g., starting column) of each transmission. For example, RV0 starts at column 0, or at the first bit of the encoded data computed in accordance with the LDPC code of FIG. 5. RV1 starts at column 13 (or the 14th bit), RV 2 starts at the 25th column (or the 26th bit), and RV 3 starts at the 43rd column (or the 44th bit).

The circular buffer 704 contains coded bits (excluding shortened bits) corresponding to a minimum rate Rmin. A first transmission uses a first redundancy version order RV0 while retransmissions may start at a different redundancy version order RV1, RV2, or RV3. Typically, using the RV order of RV0, RV2, RV3, RV1 gives good performance. The actual length of the retransmission may cause the bits to be transmitted to extend past an end of the encoded data and continue from the beginning of the encoded bits. For example, if RV3 is of sufficient length, it will extend from column 43 to the end and continue from the beginning until the number of bits corresponding to the length of RV3 is reached.

In some cases, a retransmitted sequence may not support self-decodability. That is, there may be cases where only parity bits (non-core part 504) are transmitted. In at least some cases, if the retransmitted sequence does not include bits in the systematic or core part 502, it cannot be self-decoded. For example, RV1 starts after the systematic bits and may not be long enough to circle back around to the beginning of the buffer to the start of the systematic bits. In situations where self-decodability for each RV is desired, RVS based only on the original ordering of the encoded bits may be insufficient.

Figure 8:
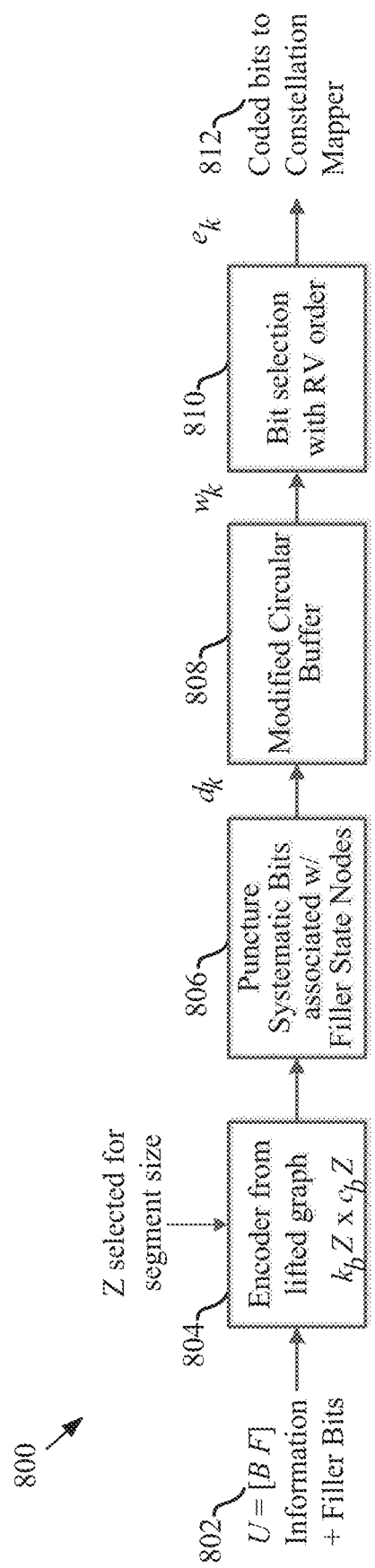
FIG. 8 is a block diagram illustrating a HARQ transmission process to facilitate self-decodability.

FIG. 8 is a block diagram illustrating a HARQ transmission process 800 to facilitate self-decodability. This process 800 is similar to the process 600 (FIG. 6), but a modified circular buffer 808 is used. According to one embodiment, the modified circular buffer 808 is "modified" in that an ordering of bits within the circular buffer 808 is modified or changes from an original encoded order of bits. In this modified circular buffer, there may be no change for the first transmission, such as when bits are transmitted according to RV0 discussed previously.

If a retransmission is required, then the original order of encoded bits may be modified. For example, the core or systematic bits in the circular buffer may be reordered and at least some of the t bits from the core or systematic part of the base graph are included in the retransmission. For instance, the bits in the core or systematic part may be permutated (e.g., pseudo-randomly or pseudo-cyclically reordered), and the modified circular buffer 408 is filled first with permutated core or systematic bits and then with non-core or parity bits in their original order. Such permutation may be random or in a row-column pattern. According to one example, for a retransmission t, a fraction $\alpha_t$ of the bits are selected from the core or systematic part, where a total of $N_t$ bits are to be transmitted and $t \geq 0$. The number of retransmitted core/systematic bits is $K_t = [\alpha_t N_c]$, $0 < \alpha_t < 1$, where $N_c$ is the total number of bits in the core or systematic part (e.g., core or systematic bits). Then, the total number of bits in the non-core or parity part (e.g., non-core or parity bits) with RV order are $N_t^P = N_t - K_t$.

Figure 9:
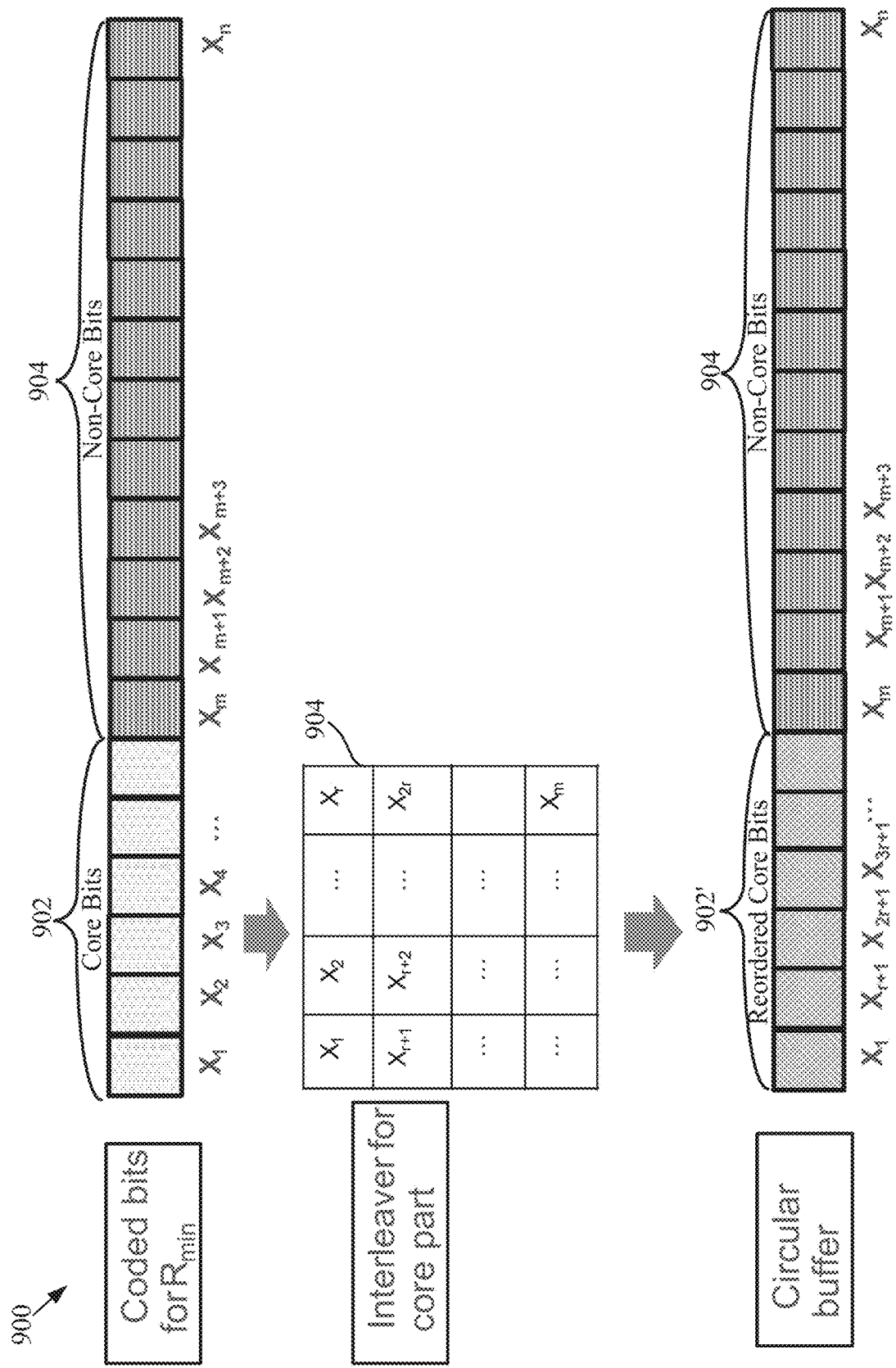
FIG. 9 illustrates an example of how encoded bits, such as those within a circular buffer, may be reordered for or during a retransmission.

FIG. 9 illustrates an example of how encoded bits, such as those within a circular buffer, may be reordered for or during a retransmission. In the illustrated embodiment, only core bits 902 are passed through an interleaver 904 to reorder them. The interleaver 904 may be a row-column interleaver or other type of interleaver that results in the reordering of the core or systematic bits 902. The interleaved core bits 902' are used to fill part of the circular buffer while the rest of the circular buffer is filled by the non-core bits 904 without change in their order. The reordering may be done within the circular buffer, such as by retrieving the core bits, passing them through an interleaver, and storing them again in the circular buffer. The reordering may also be done by pulling out the bits in a different order than they are stored within the buffer. For example, an interleaver may be used for selecting bits from within encoded bits or circular buffer during a transmission process. The illustrated reordering may represent the logical effect of the resulting order of stored or transmitted bits.

Figure 10:
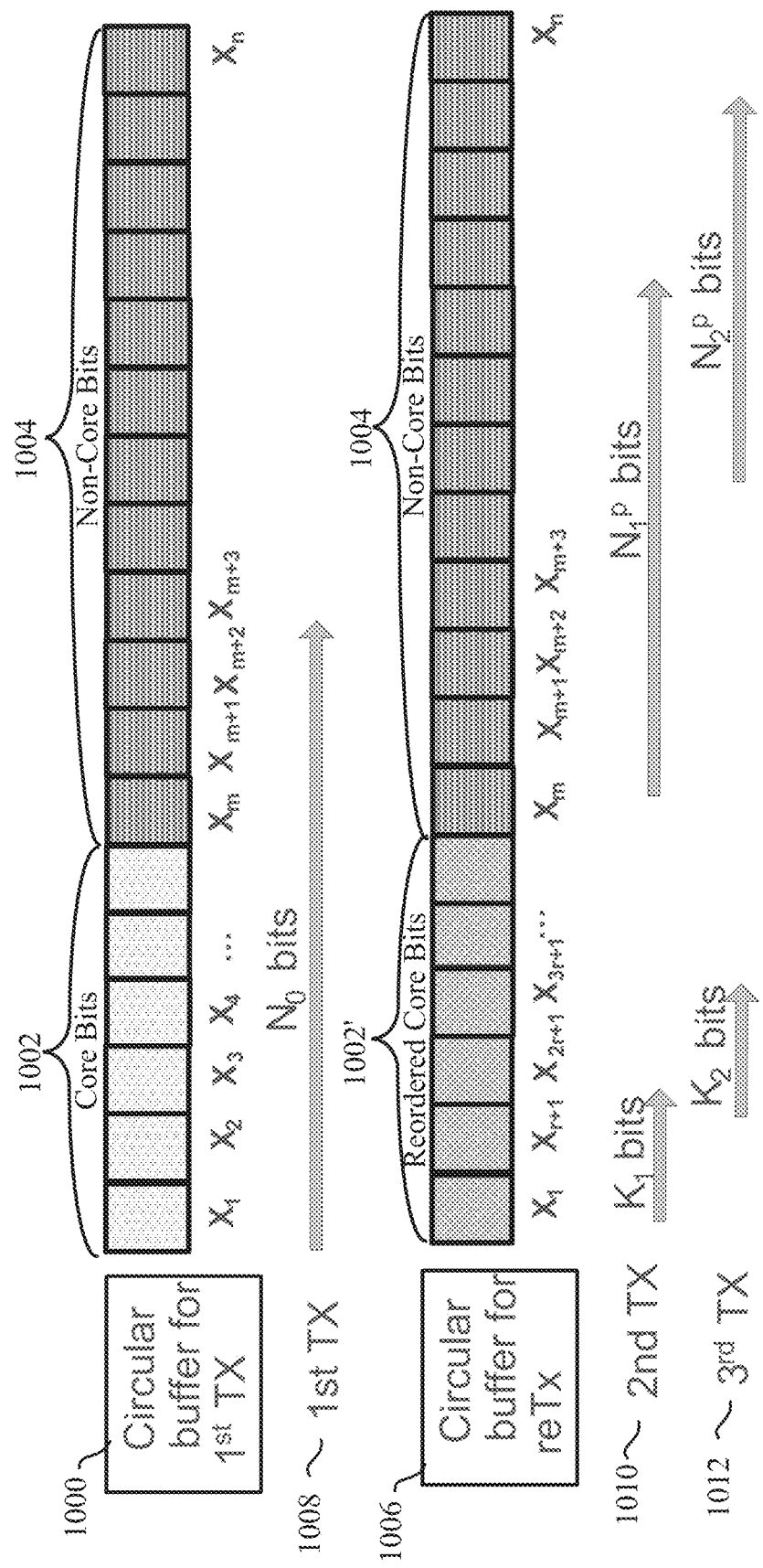
FIG. 10 illustrates HARQ transmissions using low-density parity-check (LDPC) coding and reordering of a circular buffer during retransmissions.

FIG. 10 illustrates HARQ transmissions using low-density parity-check (LDPC) coding and reordering of a circular buffer during retransmissions. During a first transmission, a circular buffer 1000 is filled with bits encoded using an LDPC code that employs a quasi-cyclic lifting structure (e.g., a sparse bipartite graph or a base graph). These coded bits may include a first set of bits 1002 encoded with a core (systematic) part of the base graph which are referred to as core or systematic bits. The coded bits may also include a second set of bits 1004 encoded with a non-core (parity) part of the base graph which are referred to as non-core or parity bits. A plurality of encoded bits $N_0$ from the circular buffer 1000 are transmitted 1008 according to a bit selection defined by a first redundancy version order (RV0). As shown, $N_0$ starts at a beginning of the encoded bits and extends through the core bits into non-core bits.

If a retransmission of this data is required, then the core bits 1002 are reordered (either logically or within the buffer) to obtain reordered bits 1002'. A retransmission circular buffer 1006 may be filled with the reordered core bits 1002' and the non-core (parity) bits 1004. A first plurality of core bits $K_1$, and a second plurality of non-core bits $N_1^P$ are then transmitted 1010 from the circular buffer 1006 according to a bit selection defined by a second redundancy version order (e.g., RV2).

If yet another retransmission of this data is required, then the order of the reordered bits 1002' may be maintained, but a different portion of the reordered bits are selected for retransmission. A second plurality of core bits $K_2$, and a third plurality of non-core bits $N_2^P$ are then transmitted from the circular buffer 1006 according to a bit selection defined by a third redundancy version order (e.g., RV3). An additional retransmission may select a third plurality of core bits and a fourth plurality of non-core bits may be transmitted.

The illustrated reordering may be performed by moving or replacing ordered bits with reordered bits or may be performed during read out of bits for transmission. For example, the encoded bits within the circular buffer may stay in their original order but the bits may be read out in a reordered fashion during retransmission. This may help limit memory requirements, limit complexity of the circular buffer and associated circuitry, or limit time needed to generate the reordered bits. As illustrated by $K_1$ and $N_1$ being non-consecutive bits, the bits may be read out in a different order than actually stored.

In one implementation, the reordering may be performed to guarantee that some fraction of the core bits will be transmitted in each retransmission. The fraction of core bits picked in each retransmission may depend on the transmission rate and block length. A good choice for the fraction $\alpha_t$ would result in a good tradeoff between HARQ gain and self-decodability. In at least one implementation the manner for reordering encoded bits, the starting points $K_1$, $N_1$, $K_2$, $N_2$, and the like may be predetermined such that a receiver can correctly identify which information or parity bits are at which locations in the transmission.

Figure 11:
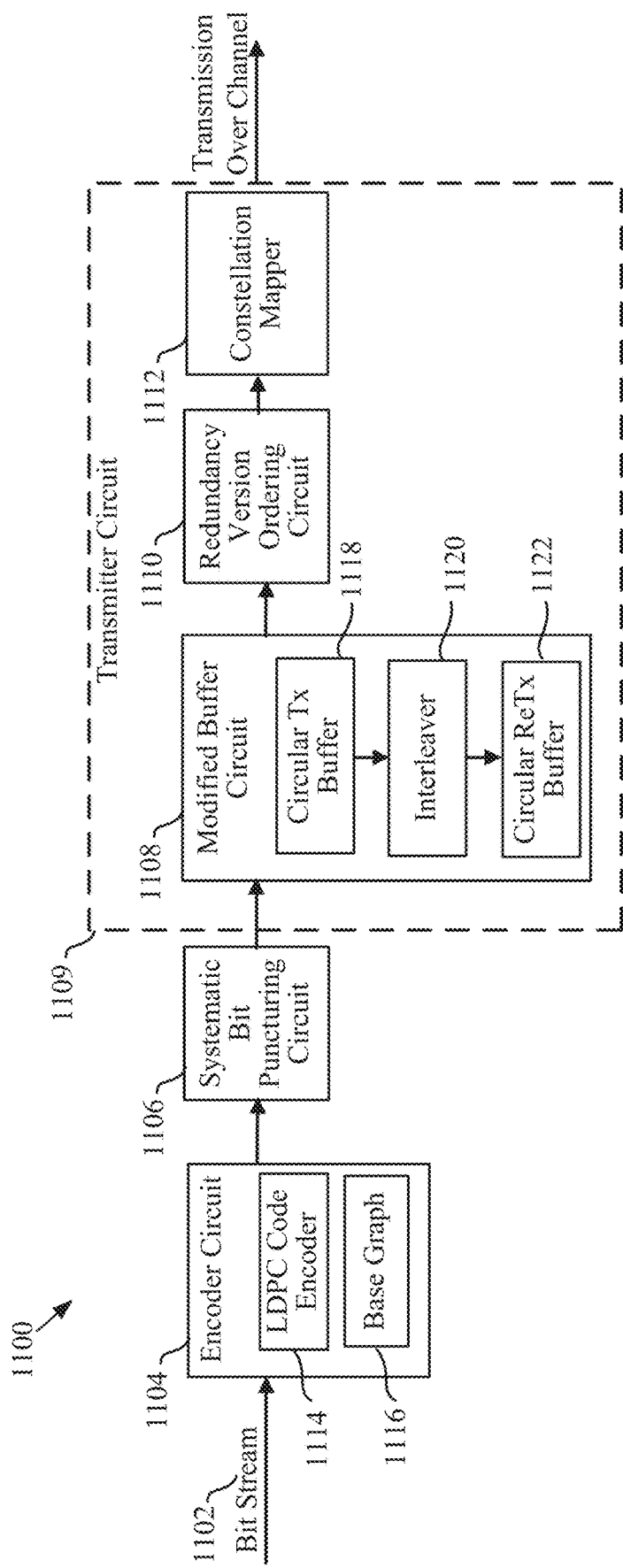
FIG. 11 is a block diagram illustrating an example of a bit encoding and transmission circuit.

FIG. 11 is a block diagram illustrating an example of a bit encoding and transmission circuit. A bit stream 1102 is received by an encoder circuit 1104 where an encoder 1104 for encoding data using a low-density parity check code encoder 1114 to obtain encoded data, where the encoded data includes core data and non-core data. For instance, the low-density parity-check (LDPC) code encoder 1114 may apply a base graph 1116 to obtain encoded bits. The base graph 1116 may include a quasi-cyclic lifting structure, which may be a sparse bipartite graph. The encoded bits may include a first set of bits encoded with a core (systematic) part of the base graph which are referred to as core or systematic bits, and a second set of bits encoded with a non-core (parity) part of the base graph which are referred to as non-core or parity bits. The encoded bits may be sent to a systematic bit puncturing circuit 1106 which removes some of non-core (parity) bits. A transmitter circuit 1109 may be configured for transmitting a plurality of redundancy versions of the encoded data, wherein all redundancy versions of encoded data include core data, and each of the transmitted redundancy versions of the encoded data includes at least a different subset of the core data.

In one example, the encoded bits are then received at the modified buffer circuit 1108 for storing the encoded data for transmission. On a first transmission, the encoded bits may be placed on a circular transmit buffer 1118 from where a redundancy version ordering circuit 1110 extracts them for transmission, according to a first redundancy version order, through a constellation mapper 1112.

If the encoded bits are to be retransmitted, then an interleaver 1120 modifies the order of the first set of bits and places them in a circular retransmit buffer 1122 for transmission according to a different redundancy version order. Alternatively, the bits may be left in their original encoded order and read out/transmitted according to a reordering. Note that the circular transmit buffer 1118 may be reused as the circular retransmit buffer 1122. By reordering the core or systematic bits for retransmission, it may be guaranteed that the second or other subsequent redundancy version will transmit some of the core or systematic bits, which greatly increases the probably for self-decodability by a receiver. If additional retransmissions are needed, the reordered first set of bits (core or systematic bits) may be used and transmitted according to a different redundancy version orders.

In some implementations, the core data is reordered prior to obtaining at least one of the different subsets of core data.

According to one example, a transmission of a first redundancy version of the encoded data may include all of the core data, while a transmission of a second redundancy version of the encoded data may include only a subset of the core data.

In some instances, transmitting the plurality of redundancy versions of the encoded data may include: (a) transmitting a first redundancy version of the encoded data, wherein the first redundancy version of the encoded data includes at least a first subset of the core data; (b) transmitting a second redundancy version of the encoded data, wherein the second redundancy version of the encoded data includes at least a second subset of the core data different from the first subset of core data, and where the core data is reordered prior to obtaining the second subset of core data; and/or (c) transmitting a third redundancy version of the encoded data, wherein the third redundancy version of the encoded data includes at least a third subset of the core data different from the first and second subsets of core data, and the same reordered core data is used to obtain the second and third subsets of core data.

Figure 12:
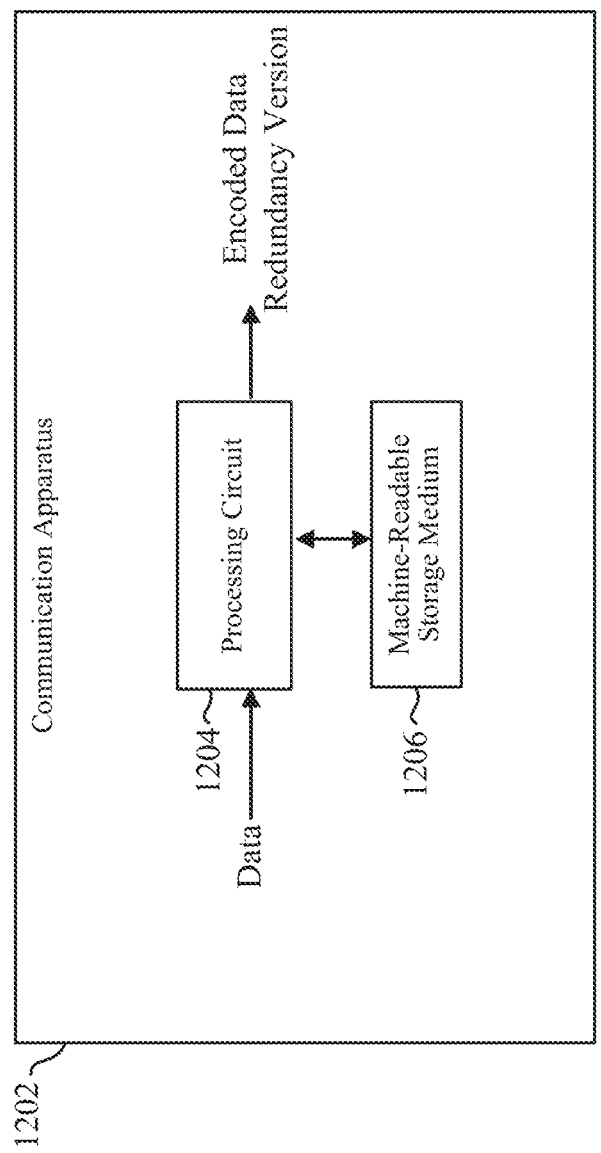
FIG. 12 is a block diagram of an example of a communication apparatus configured to send HARQ transmissions using LDPC coding while reordering a buffer for retransmissions.

FIG. 12 is a block diagram of an example of a communication apparatus configured to perform hybrid automatic repeat request (HARQ) transmissions using low-density parity-check (LDPC) coding while reordering a buffer for retransmissions. The apparatus 1202 may include a processing circuit 1204 coupled to a machine-readable medium 1206. The machine-readable medium may store one or more instructions which when executed by the processing circuit, causes the processing circuit to: (a) encode data using a low-density parity check code to obtain encoded data, where the encoded data includes core data and non-core data; (b) store the encoded data in a buffer for transmission; and/or (c) transmit a plurality of redundancy versions of the encoded data, wherein all redundancy versions of encoded data include core data, and each of the transmitted redundancy versions of the encoded data includes at least a different subset of the core data. The instructions may include reordering the core data prior to obtaining at least one of the different subsets of core data.

While in some implementations the LDPC coding may be used as part of HARQ transmission, it is contemplated that the modified LDPC coding to be applicable to other types of transmissions as well.

Figure 13:
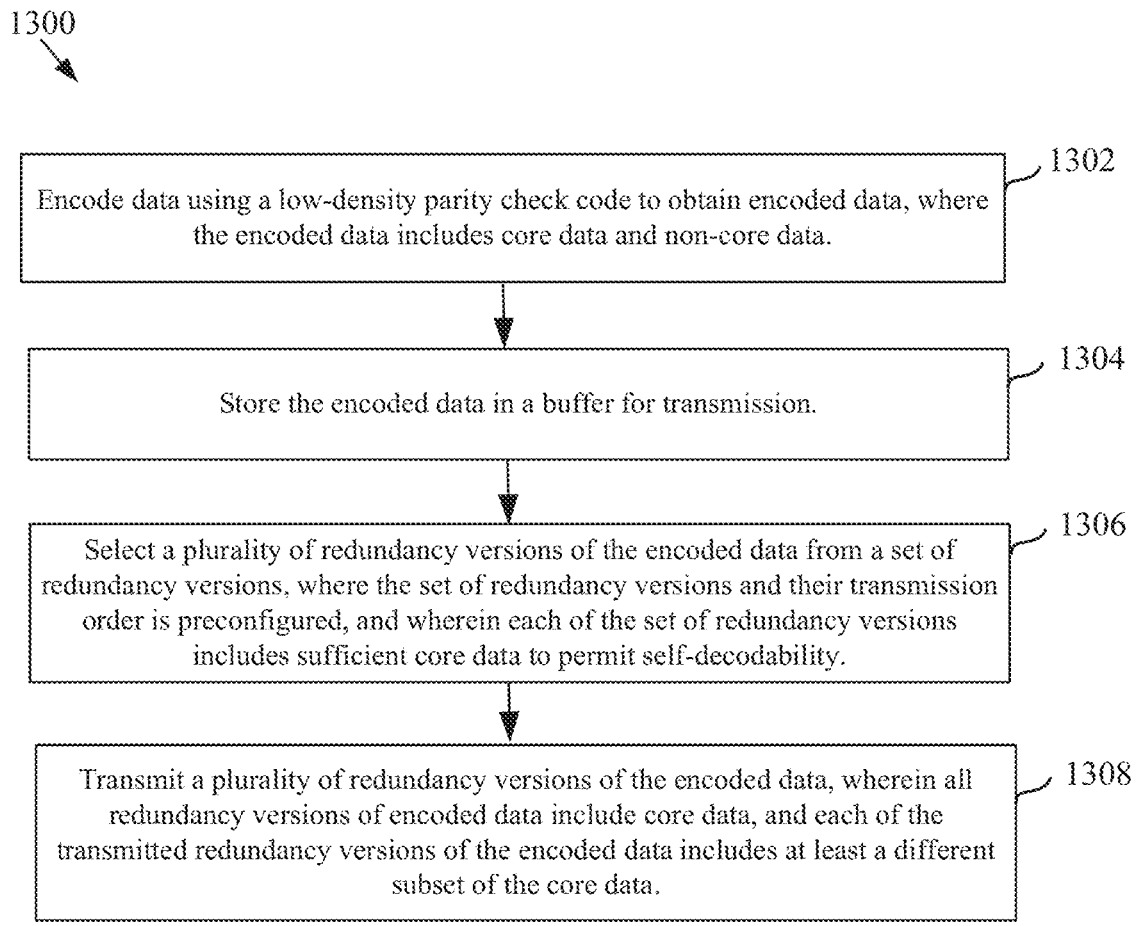
FIG. 13 illustrates an example of a method for HARQ transmissions using LDPC coding and reordering of a buffer during retransmissions.

FIG. 13 illustrates an example of a method for HARQ transmissions using low-density parity-check (LDPC) coding and reordering of a buffer during retransmissions. The method may be implemented, for example, in the device/apparatus illustrated in FIGS. 11 and 12. Data may be encoded using a low-density parity check code to obtain encoded data, where the encoded data includes core data and non-core data 1302. The low-density parity check code may use a quasi-cyclic lifting structure. For instance, the quasi-cyclic lifting structure may be a sparse bipartite graph having a core part that is more densely populated than a non-core part. The non-core data may include parity data for forward error correction.

The encoded data may then be stored in a buffer for transmission 1304. In one example, the buffer may be a circular buffer.

A plurality of redundancy versions of the encoded data may be selected from a set of redundancy versions, where the set of redundancy versions and their transmission order is preconfigured, and wherein each of the set of redundancy versions includes sufficient core data to permit self-decodability 1306. The plurality of redundancy versions of the encoded data is then transmitted, wherein all redundancy versions of encoded data include core data, and each of the transmitted redundancy versions of the encoded data includes at least a different subset of the core data 1308. The core data may be reordered prior to obtaining at least one of the different subsets of core data. Alternatively, the core data may be retrieved according to a new order to obtain the at least one of the different subsets of core data.

In some aspects, a transmission of a first redundancy version of the encoded data includes all of the core data, while a transmission of a second redundancy version of the encoded data includes fewer than all of the core data.

In one example, each of the transmitted redundancy versions of the encoded data includes sufficient core data to permit self-decodability of the transmission at a receiver.

In a second example, each of the set of redundancy versions may have a first starting point for the core data and a second starting point for the non-core data, which are known to the intended receiver.

According to another example, transmitting a plurality of redundancy versions of the encoded data may include: (a) transmitting a first redundancy version of the encoded data, wherein the first redundancy version of the encoded data includes at least a first subset of the core data; (b) transmitting a second redundancy version of the encoded data, wherein the second redundancy version of the encoded data includes at least a second subset of the core data different from the first subset of core data, and where the core data is reordered prior to obtaining the second subset of core data; and/or (c) transmitting a third redundancy version of the encoded data, wherein the third redundancy version of the encoded data includes at least a third subset of the core data different from the first and second subsets of core data, and the same reordered core data is used to obtain the second and third subsets of core data. In one example, the first subset of the core data may include all the core data. In another example, the second subset of the core data may include fewer than all the core data. In yet another example, the second redundancy version of the encoded data includes more non-core data than the first redundancy version of the encoded data. The second redundancy version of the encoded data may be transmitted upon receipt of an indicator to retransmit the encoded data. In some implementations, the first redundancy version of the encoded data may have a higher transmission rate for the data than the second redundancy version of the encoded data.

Figure 14:
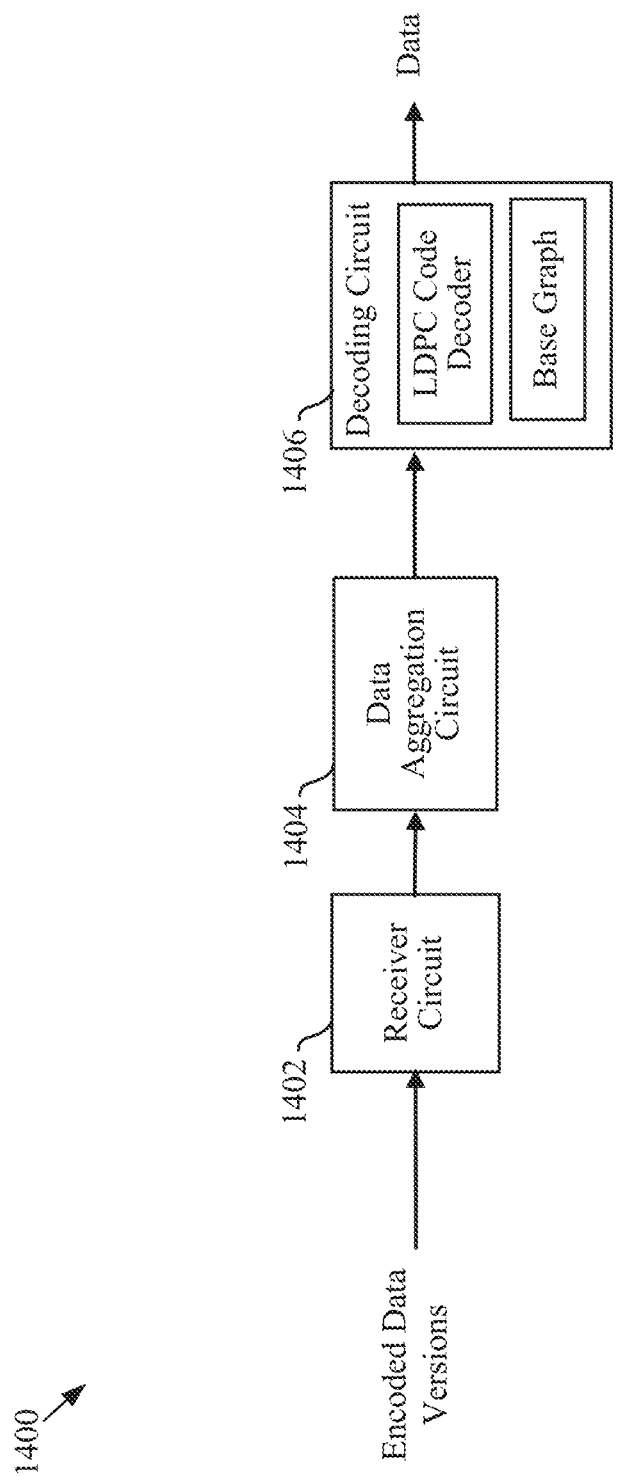
FIG. 14 is a block diagram illustrating an example of a receiver and data decoding circuit.

FIG. 14 is a block diagram illustrating an example of a receiver and data decoding circuit. A receiver circuit 1402 may be configured to receive a plurality of redundancy versions of encoded data, where the encoded data includes core data and non-core data, wherein each of the received redundancy versions of the encoded data includes at least a different subset of the core data. A data aggregation circuit 1404 may be coupled to the receiver circuit and configured to obtain the encoded data from one or more of the plurality of redundancy versions of encoded data. For instance, the encoded data may be obtained by combining likelihood ratios for the received plurality of redundancy versions of the encoded data. In one example, a first redundancy version of the encoded data includes all of the core data, while a second redundancy version of the encoded data includes less than all the core data.

A decoding circuit 1406 may serve to decode the encoded data using a low-density parity check code to obtain decoded data.

In one example implementation, the receiver circuit may be further configured to: (a) receive a first redundancy version of the encoded data, wherein the first redundancy version of the encoded data includes at least a first subset of the core data; (b) receive a second redundancy version of the encoded data, wherein the second redundancy version of the encoded data includes at least a second subset of the core data different from the first subset of core data, and where the second subset of core data is based on a reordered version of the core data relative to the first subset of core data, and/or (c) receive a third redundancy version of the encoded data, wherein the third redundancy version of the encoded data includes at least a third subset of the core data different from the first and second subsets of core data, and the second subset and third subset of core data is based on the same reordered core data.

Figure 15:
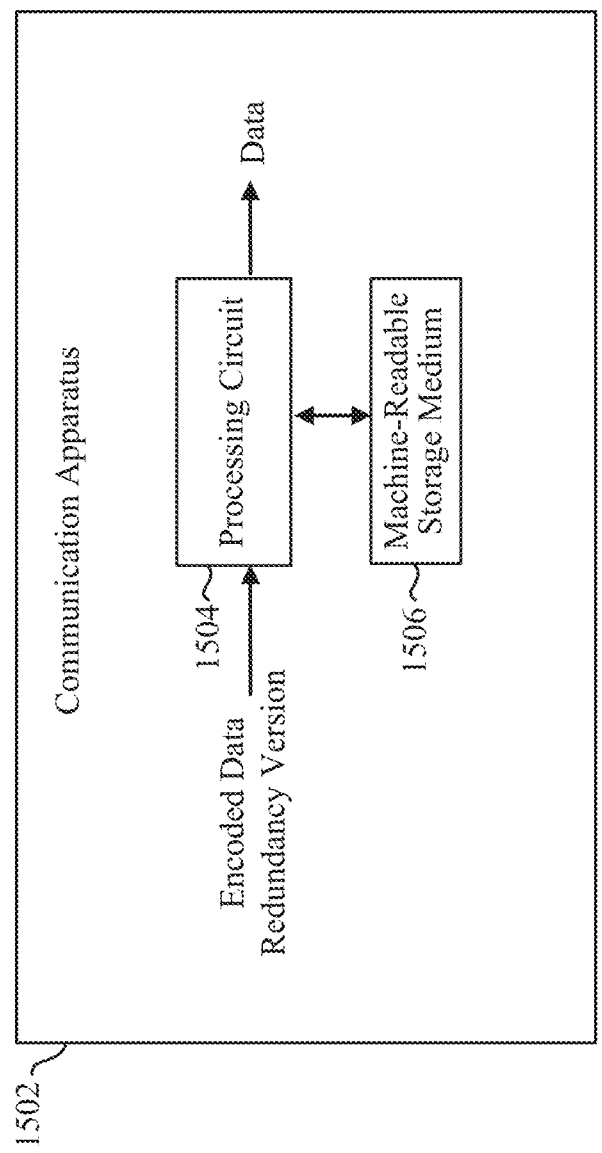
FIG. 15 is a block diagram of an example of a communication apparatus configured to perform HARQ reception using a modified LDPC coding.

FIG. 15 is a block diagram of an example of a communication apparatus configured to perform hybrid automatic repeat request (HARQ) reception using a modified low-density parity-check (LDPC) coding. The apparatus 1502 may include a processing circuit 1504 coupled to a machine-readable medium 1506. The machine-readable medium may include one or more instructions which when executed by the processing circuit, causes the processing circuit to: (a) receive a plurality of redundancy versions of encoded data, where the encoded data includes core data and non-core data, wherein each of the received redundancy versions of the encoded data includes at least a different subset of the core data; (b) obtain the encoded data from one or more of the plurality of redundancy versions of encoded data; and/or (c) decode the encoded data using a low-density parity check code to obtain decoded data.

In one example, the machine-readable medium may further include one or more instructions which when executed by the processing circuit, causes the processing circuit to: (a) receive a first redundancy version of the encoded data, wherein the first redundancy version of the encoded data includes at least a first subset of the core data; (b) receive a second redundancy version of the encoded data, wherein the second redundancy version of the encoded data includes at least a second subset of the core data different from the first subset of core data, and where the second subset of core data is based on a reordered version of the core data relative to the first subset of core data; and/or (c) receive a third redundancy version of the encoded data, wherein the third redundancy version of the encoded data includes at least a third subset of the core data different from the first and second subsets of core data, and the second subset and third subset of core data is based on the same reordered core data.

In one example implementation, the machine-readable medium may further include one or more instructions which when executed by the processing circuit, causes the processing circuit to: (a) receive a first redundancy version of the encoded data, wherein the first redundancy version of the encoded data includes at least a first subset of the core data; (b) receive a second redundancy version of the encoded data, wherein the second redundancy version of the encoded data includes at least a second subset of the core data different from the first subset of core data, and where the second subset of core data is based on a reordered version of the core data relative to the first subset of core data, and/or (c) receive a third redundancy version of the encoded data, wherein the third redundancy version of the encoded data includes at least a third subset of the core data different from the first and second subsets of core data, and the second subset and third subset of core data is based on the same reordered core data.

Figure 16:
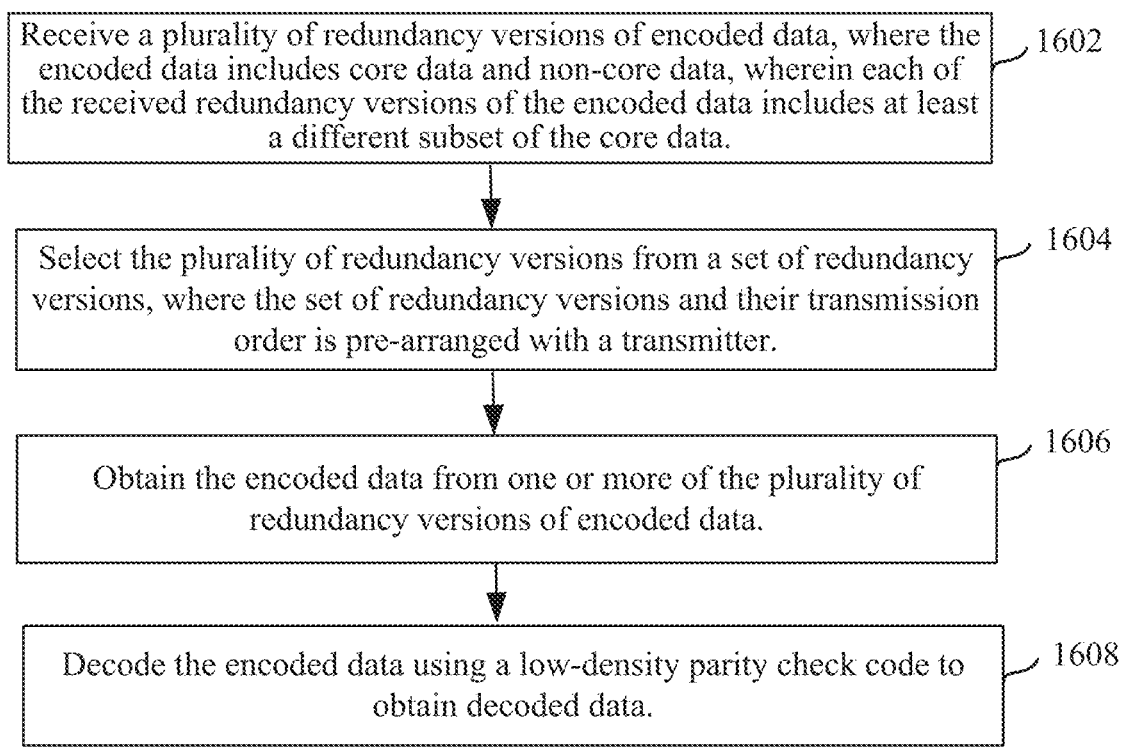
FIG. 16 is a block diagram illustrating an example of a method for receiving HARQ transmissions using LDPC coding with reordered retransmissions.

FIG. 16 is a block diagram illustrating an example of a method for receiving hybrid automatic repeat request (HARQ) transmissions using low-density parity-check (LDPC) coding with reordered retransmissions. The method may be implemented, for example, in a receiver device/apparatus illustrated in FIGS. 14 and/or 15.

A plurality of redundancy versions of encoded data may be received (e.g., over the air) at the apparatus, where the encoded data includes core data and non-core data, wherein each of the received redundancy versions of the encoded data includes at least a different subset of the core data 1602. In one example, the encoded data may be obtained by combining likelihood ratios for the received plurality of redundancy versions of the encoded data. The non-core data may include parity data for forward error correction.

A plurality of redundancy versions may be selected from a set of redundancy versions, where the set of redundancy versions and their transmission order is pre-arranged with a transmitter 1604. In one example, each of the received redundancy versions of the encoded data includes sufficient core data to permit self-decodability of the encoded data.

The encoded data may be obtained from one or more of the plurality of redundancy versions of encoded data 1606. In one example, the encoded data is obtained by combining likelihood ratios for the received plurality of redundancy versions of the encoded data. In one implementations, a first redundancy version of the encoded data includes all of the core data, while a second redundancy version of the encoded data includes less than all the core data.

The encoded data may be decoded using a low-density parity check code to obtain decoded data 1608. The low-density parity check code may use a quasi-cyclic lifting structure. In one example, the quasi-cyclic lifting structure may be a sparse bipartite graph having a core part that is more densely populated than a non-core part.

Each of the set of redundancy versions may have a first starting point for the core data and a second starting point for the non-core data, which are provided to the receiver.

In one example implementation, receiving a plurality of redundancy versions of the encoded data may include: (a) receiving a first redundancy version of the encoded data, wherein the first redundancy version of the encoded data includes at least a first subset of the core data; (b) receiving a second redundancy version of the encoded data, wherein the second redundancy version of the encoded data includes at least a second subset of the core data different from the first subset of core data, and where the second subset of core data is based on a reordered version of the core data relative to the first subset of core data, and/or (c) receiving a third redundancy version of the encoded data, wherein the third redundancy version of the encoded data includes at least a third subset of the core data different from the first and second subsets of core data, and the second subset and third subset of core data is based on the same reordered core data. In one example, the first subset of the core data may include all the core data. In another example, the second subset of the core data may include fewer than all the core data. In some instances, the second redundancy version of the encoded data includes more non-core data than the first redundancy version of the encoded data.

In one example, the receiver may send an indicator to retransmit the encoded data prior to receiving the second redundancy version of the encoded data.

In various implementations, a block length of the second redundancy version of the encoded data may be different than first redundancy version of the encoded data or it may be the same as first redundancy version of the encoded data.

While certain example embodiments have been described and shown in the accompanying drawings, it is to be understood that such embodiments are merely illustrative of and not restrictive on the broad invention, and that this invention not be limited to the specific constructions and arrangements shown and described, since various other modifications may occur to those ordinarily skilled in the art. The example embodiments are provided to illustrate certain concepts of the disclosure. Those of ordinary skill in the art will appreciate that these are example in nature, and other examples may fall within the scope of the disclosure and the appended claims.

As those of ordinary skill in the art will readily appreciate, various aspects described throughout this disclosure may be extended to any suitable telecommunication system, network architecture, and communication standard. By way of example, various aspects may be applied to UMTS systems such as W-CDMA, TD-SCDMA, and TD-CDMA. Various aspects may also be applied to systems employing Long Term Evolution (LTE) (in FDD, TDD, or both modes), LTE-Advanced (LTE-A) (in FDD, TDD, or both modes), LTE-Advanced Pro, 5G New Radio, CDMA 2000, Evolution-Data Optimized (EV-DO), Ultra Mobile Broadband (UMB), IEEE 802.11 (Wi-Fi), IEEE 802.16 (WiMAX), IEEE 802.20, Ultra-Wideband (UWB), Bluetooth, and/or other suitable systems, including those described by yet-to-be defined wide area network standards. The actual telecommunication standard, network architecture, and/or communication standard employed will depend on the specific application and the overall design constraints imposed on the system.

Within the present disclosure, the word "example" is used to mean "serving as an example, instance, or illustration." Any implementation or aspect described herein as "example" is not necessarily to be construed as preferred or advantageous over other aspects of the disclosure. Likewise, the term "aspects" does not require that all aspects of the disclosure include the discussed feature, advantage, or mode of operation. The term "coupled" is used herein to refer to the direct or indirect mechanical and/or electrical coupling between two objects. For example, if object A physically touches and/or electrically communicates with object B, and object B physically touches and/or electrically communicates with object C, then objects A and C may still be considered coupled to one another—even if they do not directly physically touch and/or electrically communicate with each other. For instance, a first die may be coupled to a second die in a package even though the first die is never directly physically in contact with the second die. The terms "circuit" and "circuitry" are used broadly, and intended to include both hardware implementations of electrical devices and conductors that, when connected and configured, enable the performance of the functions described in the present disclosure, without limitation as to the type of electronic circuits, as well as software implementations of information and instructions that, when executed by a processor, enable the performance of the functions described in the present disclosure.

One or more of the components, blocks, features, and/or functions illustrated in above may be rearranged and/or combined into a single component, block, feature, or function or implemented in several components, blocks, features, and/or functions. Additional components, blocks, features, and/or functions may also be added without departing from novel features disclosed herein. The apparatus, devices, and/or components illustrated above may be adapted (e.g., constructed, configured, employed, implemented, and/or programmed) to perform one or more of the methods, blocks, features, and/or functions described herein. The algorithms described herein may also be efficiently implemented in software and/or embedded in hardware.

It is to be understood that the specific order or hierarchy of blocks in the methods disclosed is an illustration of example processes. It is understood that the specific order or hierarchy of blocks in the methods may be rearranged. The accompanying method claims present elements of the various blocks in a sample order, and are not meant to be limited to the specific order or hierarchy presented unless specifically recited therein.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but are to be accorded the full scope consistent with the language of the claims, wherein reference to an element in the singular is not intended to mean "one and only one" unless specifically so stated, but rather "one or more." Unless specifically stated otherwise, the term "some" refers to one or more. A phrase referring to "at least one of" a list of items refers to any combination of those items, including single members. As an example, "at least one of: a, b, or c" is intended to cover: a; b; c; a and b; a and c; b and c; and a, b and c. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112(f), unless the element is expressly recited using the phrase "means for" or, in the case of a method claim, the element is recited using the phrase "step for."

What is claimed is:

1. A method for wireless communication at a transmitter, comprising:
    encoding data using a low-density parity check code to obtain encoded data, where the encoded data includes core data and non-core data, the core data comprising systematic bits and the non-core data comprising parity bits;
    storing the encoded data in a buffer for transmission;
    transmitting a first transmission based on a first redundancy version of a plurality of redundancy versions of the encoded data;
    selecting a fraction of bits of core data for retransmission based on a transmission rate and a block length; and
    transmitting a retransmissions based on a second redundancy version of the plurality of redundancy versions of the encoded data, wherein each of the plurality of redundancy versions of the encoded data includes at least a different subset of the core data, wherein the second redundancy version comprises a first set of bits from the core data and a second set of bits from the non-core data, the first set of bits from the core data comprising a number of bits based on the fraction of bits.

2. The method of claim 1, further comprising:
    reordering the core data prior to obtaining at least one of the different subsets of core data.

3. The method of claim 1, wherein the first redundancy version of the encoded data includes all of the core data, while transmission of the second redundancy version of the encoded data includes fewer than all bits of the core data.

4. The method of claim 1, wherein each of the plurality of redundancy versions of the encoded data includes sufficient core data to permit self-decodability of the transmission at a receiver.

5. The method of claim 1, further comprising:
    selecting the plurality of redundancy versions from a set of redundancy versions, where the set of redundancy versions and their transmission order is preconfigured, and wherein each of the set of redundancy versions includes sufficient core data to permit self-decodability.

6. The method of claim 5, wherein each of the set of redundancy versions has a first starting point for the core data and a second starting point for the non-core data, which are known to an intended receiver.

7. The method of claim 6, wherein the first set of bits of the second redundancy version includes the number of bits beginning at the first starting point.

8. The method of claim 1, wherein the low-density parity check code uses a quasi-cyclic lifting structure, where the quasi-cyclic lifting structure is a sparse bipartite graph having a core part that is more densely populated than a non-core part.

9. The method of claim 1, wherein the core data used for transmitting based on the first redundancy version is reordered prior to obtaining the first set of bits from the core data.

10. The method of claim 1, wherein the first redundancy version includes all the core data, and the second redundancy version includes less than all the core data.

11. The method of claim 1, wherein the second redundancy version of the encoded data includes more non-core data than the first redundancy version of the encoded data.

12. The method of claim 1, wherein the first redundancy version of the encoded data has a higher transmission rate for the data than the second redundancy version of the encoded data.

13. The method of claim 1, further comprising:
    transmitting based on a third redundancy version of the encoded data, wherein a same reordered core data is used to obtain the second redundancy version and third redundancy.

14. The method of claim 1, wherein the buffer is a circular buffer.

15. An apparatus, comprising:
    one or more processors;
    memory in electronic communication with the one or more processors, the memory storing instructions which, when executed by the one or more processors, cause the apparatus to:
        encode data using a low-density parity check code to obtain encoded data, where the encoded data includes core data and non-core data, the core data comprising systematic bits and the non-core data comprising parity bits;
        store the encoded data for transmission;
        transmit a first transmission based on a first redundancy version of a plurality of redundancy versions of the encoded data;
        select a fraction of bits of core data for retransmission based on a transmission rate and a block length;
        transmit a retransmission based on a second redundancy version of the plurality of redundancy versions of the encoded data, wherein each of the plurality of redundancy versions of the encoded data includes at least a different subset of the core data, wherein the second redundancy version comprises a first set of bits from the core data and a second set of bits from the non-core data, the first set of bits from the core data comprising a number of bits based on the fraction of bits.

16. The apparatus of claim 15, wherein the memory further storing instructions that cause the apparatus to reorder the core data prior to obtaining at least one of the different subsets of the core data.

17. The apparatus of claim 15, wherein the first redundancy version of the encoded data includes all of the core data, while transmission of the second redundancy version of the encoded data includes only a subset of the core data.

18. The apparatus of claim 15, wherein the core data used for transmitting based on the first redundancy version is reordered prior to obtaining the first set of bits from the core data.

19. A method operational at a receiver, comprising:
receiving a plurality of redundancy versions of encoded data, where the encoded data includes core data and non-core data, wherein each of the received redundancy versions of the encoded data includes at least a different subset of the core data, the core data comprising systematic bits and the non-core data comprising parity bits, wherein the plurality of redundancy versions comprise a first redundancy version and a second redundancy version, wherein the second redundancy version comprises a first set of bits from the core data and a second set of bits from the non-core data, the first set of bits from the core data comprising a number of bits based on a transmission rate and a block length;
obtaining the encoded data from one or more of the plurality of redundancy versions of encoded data; and
decoding the encoded data using a low-density parity check code to obtain decoded data.

20. The method of claim 19, wherein each of the received redundancy versions of the encoded data includes sufficient core data to permit self-decodability of the encoded data.

21. The method of claim 19, further comprising:
selecting the plurality of redundancy versions from a set of redundancy versions, where the set of redundancy versions and their transmission order is pre-arranged with a transmitter.

22. The method of claim 21, wherein each of the set of redundancy versions has a first starting point for the core data and a second starting point for the non-core data, which are provided to the receiver.

23. The method of claim 19, wherein the encoded data is obtained by combining likelihood ratios for the received plurality of redundancy versions of the encoded data.

24. The method of claim 19, wherein the first redundancy version of the encoded data includes all of the core data, while the second redundancy version of the encoded data includes less than all the core data.

25. The method of claim 19, wherein the non-core data includes parity data for forward error correction.

26. The method of claim 19, wherein the low-density parity check code uses a quasi-cyclic lifting structure, where the quasi-cyclic lifting structure is a sparse bipartite graph having a core part that is more densely populated than a non-core part.

27. The method of claim 19, wherein the core data of the second redundancy version is based on a reordered version of the core data relative to the first redundancy version.

28. The method of claim 27, further comprising:
sending an indicator to retransmit the encoded data prior to receiving the second redundancy version of the encoded data.

29. The method of claim 19, further comprising:
receiving a third redundancy version of the encoded data, wherein the third redundancy version is based on same reordered core data as the second redundancy version.

30. An apparatus, comprising:
one or more processors;
memory in electronic communication with the one or more processors, the memory storing instructions which, when executed by the one or more processors, cause the apparatus to:
receive a plurality of redundancy versions of encoded data, where the encoded data includes core data and non-core data, wherein each of the received redundancy versions of the encoded data includes at least a different subset of the core data, the core data comprising systematic bits and the non-core data comprising parity bits, wherein the plurality of redundancy versions comprise a first redundancy version and a second redundancy version, wherein the second redundancy version comprises a first set of bits from the core data and a second set of bits from the non-core data, the first set of bits from the core data comprising a number of bits based on a transmission rate and a block length;
obtain the encoded data from one or more of the plurality of redundancy versions of encoded data; and
decode the encoded data using a low-density parity check code to obtain decoded data.

\* \* \* \* \*